(12) United States Patent
Obata et al.

(10) Patent No.: US 7,923,720 B2
(45) Date of Patent: Apr. 12, 2011

(54) ORGANIC LUMINESCENCE TRANSISTOR DEVICE AND MANUFACTURING METHOD THEREOF

(75) Inventors: Katsunari Obata, Kashiwa (JP); Shinichi Handa, Tsukuba (JP); Takuya Hata, Tsurugashima (JP); Kenji Nakamura, Tsurugashima (JP); Atsushi Yoshizawa, Tsurugashima (JP); Hiroyuki Endo, Tokyo (JP)

(73) Assignee: Dai Nippon Printing Co. Ltd., Tokyo (JP)

( * ) Notice: Subject to any disclaimer, the term of this patent is extended or adjusted under 35 U.S.C. 154(b) by 147 days.

(21) Appl. No.: 12/223,263

(22) PCT Filed: Jan. 26, 2007

(86) PCT No.: PCT/JP2007/051300
§ 371 (c)(1),
(2), (4) Date: Aug. 28, 2008

(87) PCT Pub. No.: WO2007/086520
PCT Pub. Date: Aug. 2, 2007

(65) Prior Publication Data
US 2009/0224233 A1    Sep. 10, 2009

(30) Foreign Application Priority Data

Jan. 27, 2006  (JP) ................................. 2006-018689

(51) Int. Cl.
*H01L 29/786* (2006.01)
*H01L 21/28* (2006.01)

(52) U.S. Cl. .................. 257/40; 257/E51.006; 438/689
(58) Field of Classification Search .................. 257/40, 257/51.006, 51.026; 438/689
See application file for complete search history.

(56) References Cited

U.S. PATENT DOCUMENTS

| 2002/0167280 A1 | 11/2002 | Hayahsi et al. |
| 2006/0103290 A1* | 5/2006 | Suh et al. ...................... 313/463 |

FOREIGN PATENT DOCUMENTS

| JP | A 2002-343578 | 11/2002 |
| JP | A 2003-324203 | 11/2003 |
| JP | A 2005-243871 | 9/2005 |

OTHER PUBLICATIONS

Kudo, "Current Conditions and Future Prospects of Organic Transistor," *J. Appl. Phys.*, vol. 72, No. 9, pp. 1151-1156, 2003.

* cited by examiner

*Primary Examiner* — Thomas L Dickey
(74) *Attorney, Agent, or Firm* — Oliff & Berridge, PLC

(57) ABSTRACT

The invention is an organic luminescence transistor device including:
a substrate; a first electrode layer provided on a side of an upper surface of the substrate; a layered structure provided locally on a side of an upper surface of the first electrode layer, the layered structure covering an area of a predetermined size in a plan view, the layered structure including an insulation layer, an assistance electrode layer and an electric-charge-injection inhibiting layer in this order; an organic EL layer provided on the side of an upper surface of the first electrode layer at least at an area not provided with the layered structure; and a second electrode layer provided on a side of an upper surface of the organic EL layer.

15 Claims, 13 Drawing Sheets

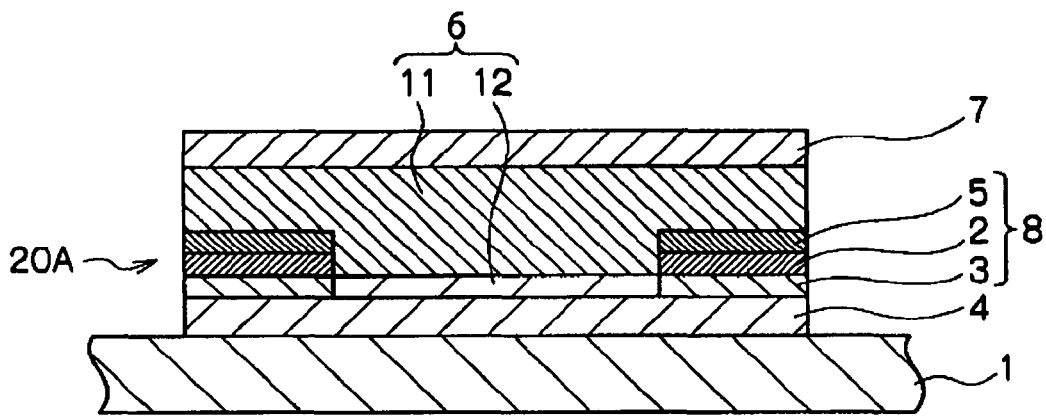
F I G. 3 A
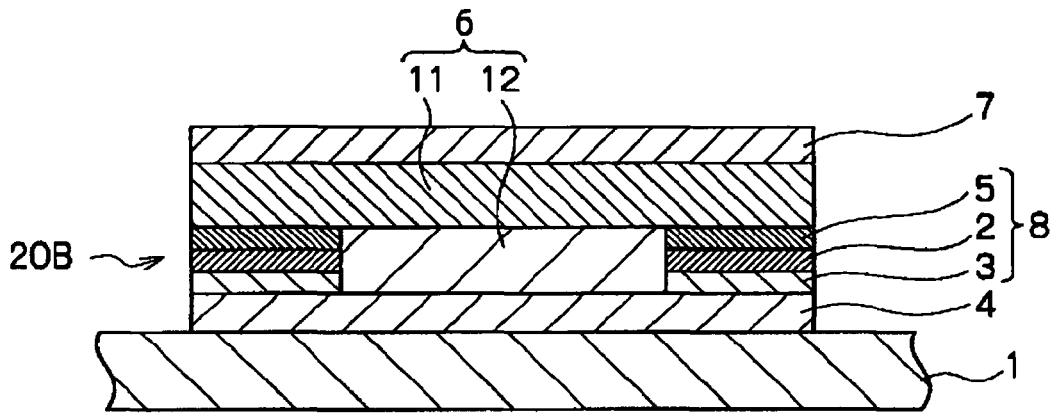
F I G. 3 B
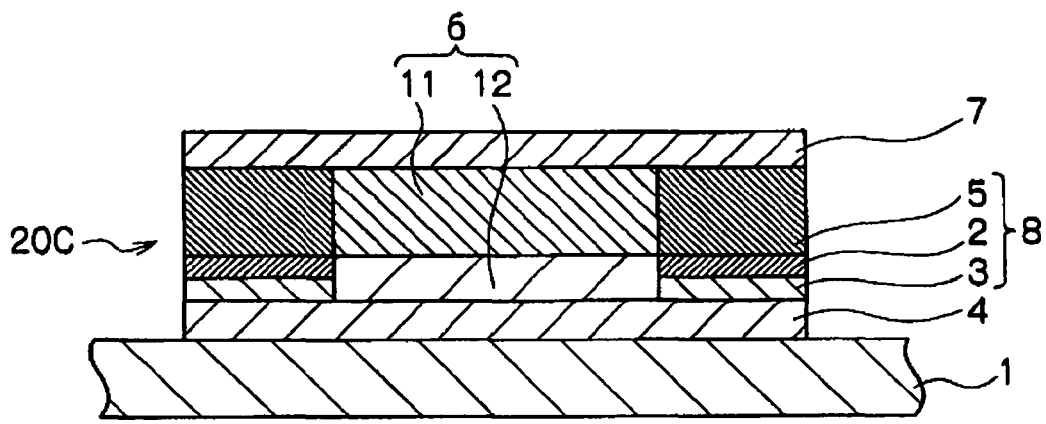
F I G. 3 C

ORGANIC LUMINESCENCE TRANSISTOR DEVICE AND MANUFACTURING METHOD THEREOF

FIELD OF THE INVENTION

This invention relates to an organic luminescence transistor device and a manufacturing method thereof. In more details, in a vertical type of organic luminescence transistor device, this invention relates to an organic luminescence transistor device and a manufacturing method thereof wherein a current control between an anode and a cathode is facilitated.

BACKGROUND ART

An organic electroluminescence device has a simple structure, so that it has been expected as a luminescence device for the next generation display that is thinner, lighter, larger area and less costly. Thus, recently, the organic electroluminescence device has been studied hard. As a driving method for driving the organic electroluminescence device, an active-matrix type of filed effect transistor (FET) that uses a thin film transistor (TFT) is considered to be advantageous in terms of operational speed and power consumption. On the other hand, as a semiconductor material for forming the thin film transistor, inorganic semiconductor materials such as a silicon semiconductor or a chemical compound semiconductor have been studied, but recently, an organic thin film transistor (organic TFT) that uses an organic semiconductor material has been also studied hard. The organic semiconductor material has been expected as a semiconductor material of the next generation. However, the organic semiconductor material has problems of a lower charge-transfer level and of a higher resistance, compared with the inorganic semiconductor material.

Regarding the filed effect transistor, a vertical FET structured type of static induction transistor (SIT) wherein the structure thereof is vertically arranged is recognized to be advantageous because a channel width of the transistor can be shortened, the whole electrode of the surface thereof can be effectively used so that rapid response and/or power enhancement can be achieved, and interface effect can be made smaller.

Accordingly, recently, based on the above advantageous features of the static induction transistor (SIT), an organic luminescence transistor composed of such an SIT structure and an organic electroluminescence device structure has been studied to be developed (for example, Kazuhiro Kudo, "Current Conditions and Future Prospects of Organic Transistor", J. Appl. Phys. Vol. 72, No. 9, pp. 1151-1156 (2003); JP-A-2003-324203 (in particular, claim 1); JP-A-2002-343578 (in particular, FIG. 23)).

FIG. 21 is a schematic sectional view showing an example of an organic luminescence transistor composed of an SIT structure and an organic electroluminescence device structure, described in the above document "Current Conditions and Future Prospects of Organic Transistor". As shown in FIG. 21, the organic luminescence transistor 101 has a vertical type of FET structure wherein a source electrode 103 consisting of a transparent electrode film, a hole-transfer layer 104 in which slit-like Schottky electrodes 105 are embedded, a luminescent layer 106, and a drain electrode 107 are layered on a glass substrate 102 in this order.

As described above, in the composite type of organic luminescence transistor 101, the slit-like Schottky electrodes 105 are embedded in the hole-transfer layer 104. A Schottky barrier junction is formed between the hole-transfer layer 104 and the gate electrode 105, so that a depletion layer is formed in the hole-transfer layer 104. The expansion of the depletion layer is varied by the gate voltage (voltage applied between the source electrode 103 and the gate electrode 105). Thus, a channel width is controlled by varying the gate voltage, and an amount of generated charge is varied by controlling a voltage to be applied between the source electrode 103 and the drain electrode 107.

FIG. 22 is a schematic sectional view showing an example of an organic luminescence transistor composed of an FET structure and an organic electroluminescence device structure, described in JP-A-2002-343578. As shown in FIG. 22, the organic luminescence transistor 111 has a substrate 112, on which an assistance electrode 113 and an insulation layer 118 are layered. Then, an anode 115 is partially formed on the insulation layer 118. Furthermore, a luminescent material layer 116 is formed on the insulation layer 118 such that the luminescent material layer 116 covers the anode 115. A cathode 117 is formed on the luminescent material layer 116. An anode buffer layer 119 is formed on the anode 115. The anode buffer layer 119 has a function of allowing passage of holes from the anode 115 to the luminescent material layer 116 but blocking passage of electrons from the luminescent material layer 116 to the anode 115. In the organic luminescence transistor 111 as well, a channel width is controlled by varying a voltage to be applied between the assistance electrode 113 and the anode 115, and an amount of generated charge is varied by controlling a voltage to be applied between the anode 115 and the cathode 117.

SUMMARY OF THE INVENTION

In the organic luminescence transistor composed of an SIT structure and an organic electroluminescence device structure, described in the above document and the above patent publications, with reference to FIG. 22, when a certain voltage ($-Vd1<0$) is applied between the anode 115 and the cathode 117, many positive holes are generated on a surface of the anode 115 opposite to the cathode 117, and the holes flow toward the cathode 117 (a flow of electric charges is formed). Herein, when a voltage $Vd=-Vd2<<-Vd1$ is applied between the anode 115 and the cathode 117 in order to obtain a greater flow of electric charges (i.e., in order to obtain a greater luminance), generation of the electric charges between the anode 115 and the cathode 117 and a flow thereof become dominant. Thus, the amount of the generated electric charges cannot be controlled by controlling the voltage (Vg) to be applied between the assistance electrode 113 and the anode 115, so that it is difficult to control the amount of the luminescence.

The present invention is accomplished in order to solve the aforementioned problems. An object of the present invention is to provide a vertical type of organic luminescence transistor device and a manufacturing method thereof wherein a current control between an anode and a cathode is facilitated.

The present invention is an organic luminescence transistor device comprising: a substrate; a first electrode layer provided on a side of an upper surface of the substrate; a layered structure provided locally on a side of an upper surface of the first electrode layer, the layered structure covering an area of a predetermined size in a plan view, the layered structure including an insulation layer, an assistance electrode layer and an electric-charge-injection inhibiting layer in this order; an organic EL layer provided on the side of an upper surface of the first electrode layer at least at an area not provided with the layered structure; and a second electrode layer provided on a side of an upper surface of the organic EL layer.

Alternatively, the present invention is an organic luminescence transistor device comprising: a substrate; a first electrode layer provided in a predetermined pattern on a side of an upper surface of the substrate; a layered structure provided on the side of an upper surface of the substrate at an area not provided with the first electrode layer, the layered structure sandwiching the first electrode layer in a plan view, the layered structure including an insulation layer, an assistance electrode layer and an electric-charge-injection inhibiting layer in this order; an organic EL layer provided at least on a side of an upper surface of the first electrode layer; and a second electrode layer provided on a side of an upper surface of the organic EL layer; wherein a thickness of the first electrode layer and a thickness of the insulation layer are adjusted in such a manner that the first electrode layer is not in contact with the assistance electrode layer.

In the present specification, "the layered structure sandwiching the first electrode layer in a plan view" includes a case wherein the first electrode layer is in contact with and sandwiched in the layered structure (insulation layer), a case wherein the first electrode layer invades the layered structure (insulation layer) to be sandwiched therein, and a case wherein the first electrode layer is not in contact with and sandwiched in the layered structure (insulation layer). The opposite sides of the first electrode layer may adopt different manners, respectively.

In the organic EL layer, when electric charges injected from the first electrode layer and the second electrode layer are united with each other, a luminescence phenomenon occurs. According to the present invention, the assistance electrode layer is provided at an intermediate area of the first electrode layer and the second electrode layer, so that an amount of electric charges generated at the first electrode layer and the second electrode layer can be increased and decreased by changing a voltage to be applied between the assistance electrode layer and the first electrode layer. As a result, an amount of the luminescence can be controlled.

In addition, according to the present invention, the assistance electrode layer is sandwiched between the insulation layer and the electric-charge-injection inhibiting layer. Thus, generation and dissipation of electric charges (positive holes or electrons) are inhibited at an upper surface and a lower surface of the assistance electrode layer. Therefore, the variable voltage at the assistance electrode layer can give a greater effect on the amount of electric charges generated at the first electrode layer and the second electrode layer.

According to the above feature, the organic luminescence transistor device of the present invention is suitably used as a luminescence device of "normally-ON" type wherein a constant voltage is applied between the first electrode layer and the second electrode layer. In addition, by controlling the voltage to be applied between the assistance electrode layer and the first electrode layer, an electric current flowing between the first electrode layer and the second electrode layer (amount of the generated electric charges) can be controlled, so that the amount of the luminescence can be controlled.

Preferably, the organic EL layer includes, at least, an electric-charge injection layer and a luminescent layer. Alternatively, preferably, the organic EL layer includes, at least, a luminescent layer including an electric-charge-injection material.

In addition, preferably, a second electric-charge injection layer is further provided between the first electrode layer and the organic EL layer and/or the layered structure provided on the first electrode layer.

In addition, preferably, a third electric-charge injection layer for the second electrode layer is provided between the organic EL layer and the second electrode layer.

In addition, preferably, the electric-charge-injection inhibiting layer is made of an insulation material (more preferably, a resist film of positive type). In this case, the electric-charge-injection inhibiting layer to face the second electrode layer can be accurately and easily formed on the assistance electrode layer.

For example, the first electrode (layer) functions as an anode, and the second electrode (layer) functions as a cathode. Alternatively, the first electrode (layer) functions as a cathode, and the second electrode (layer) functions as an anode. Whichever polarity the first electrode and the second electrode have, the amount of the electric charges can be sensitively varied by controlling the voltage (gate voltage) to be applied between the assistance electrode (layer) and the first electrode. Thus, the electric current between the first electrode and the second electrode is controlled, so that the amount of the luminescence can be controlled sensitively.

In addition, the present invention is an organic luminescence transistor comprising: an organic luminescence transistor device having any of the above features; a first voltage-feeding unit configured to apply a constant voltage between the first electrode (layer) and the second electrode (layer) of the organic luminescence transistor device; and a second voltage-feeding unit configured to apply a variable voltage between the first electrode (layer) and the assistance electrode (layer) of the organic luminescence transistor device.

According to the present invention, by means of the first voltage-feeding unit and the second voltage-feeding unit, a constant voltage can be applied between the first electrode and the second electrode, and a variable voltage can be applied between the first electrode and the assistance electrode. As a result, the amount of the electric charges can be sensitively varied, so that the electric current between the first electrode and the second electrode is controlled and the amount of the luminescence can be controlled sensitively.

In addition, the present invention is a luminescence display apparatus comprising a plurality of luminescent parts arranged in a matrix pattern, wherein each of the plurality of luminescent parts has an organic luminescence transistor device having any of the above features.

According to the luminescence display apparatus, the amount of the luminescence can be easily controlled, so that the luminance can be easily adjusted.

In addition, the present invention is a manufacturing method of an organic luminescence transistor device, the manufacturing method comprising the steps of: preparing a substrate on which a first electrode layer has been formed; providing a layered structure locally on a side of an upper surface of the first electrode layer such that the layered structure has a predetermined size in a plan view, the layered structure including an insulation layer, an assistance electrode layer and an electric-charge-injection inhibiting layer in this order; providing an organic EL layer on the side of an upper surface of the first electrode layer at an area not provided with the layered structure; and providing a second electrode layer on a side of an upper surface of the organic EL layer.

Alternatively, the present invention is a manufacturing method of an organic luminescence transistor device, the manufacturing method comprising the steps of: preparing a substrate on which a first electrode layer has been formed in a predetermined pattern; providing a layered structure on a side of an upper surface of the substrate at an area not provided with the first electrode layer such that the layered structure sandwiches the first electrode layer in a plan view, the layered structure including an insulation layer, an assistance electrode layer and an electric-charge-injection inhibiting layer in this order; providing an organic EL layer on a side of an upper surface of the first electrode layer; and providing a second electrode layer on a side of an upper surface of the organic EL layer; wherein a thickness of the first electrode layer and a thickness of the insulation layer are adjusted in such a manner that the first electrode layer is not in contact with the assistance electrode layer.

According to any of the above manufacturing methods of an organic luminescence transistor device, it is possible to form the organic EL layer easily and precisely between the layered structure(s) consisting of the insulation layer/the assistance electrode layer/the electric-charge-injection inhibiting layer. In addition, a matrix-patterned device can be achieved.

Preferably, in the step of providing the layered structure, as a material for forming the electric-charge-injection inhibiting layer, a photosensitive material (a photosensitive material of positive type) that becomes removable by photoirradiation is used; as a material for one or both of the insulation layer and the assistance electrode layer, a material that doesn't transmit an exposure wavelength of the photosensitive material is used; and after the photosensitive material is provided on the side of an upper surface of the first electrode layer so as to cover the assistance electrode layer, the photosensitive material is exposed to light from a side of the substrate so as to remove only the photosensitive material provided directly on the first electrode layer, so as to form the electric-charge-injection inhibiting layer.

In this case, it is possible to form the electric-charge-injection inhibiting layer easily and precisely (it is possible to remove an unnecessary portion easily and precisely).

In addition, preferably, in the step of providing the organic EL layer, the organic EL layer is formed by a patterning process such as a mask deposition process or an ink-jetting method. More specifically, when the organic EL layer is formed of a low-molecular material, it is preferable that the pattern formation is carried out by a mask deposition method or the like. When the organic EL layer is formed of a polymer (high-molecular) material, it is preferable that the pattern formation is carried out by an ink-jetting method or the like. According to these methods, the organic EL layer may be formed between adjacent layered structure(s), each of which consists of the insulation layer/the assistance electrode layer/the electric-charge-injection inhibiting layer. Thus, a matrix-patterned device can be achieved.

In addition, preferably, a second electric-charge injection layer made of the same material as or a different material from the electric-charge injection layer is provided in advance on the first electrode layer, before the insulation layer of the layered structure is provided on the first electrode layer or the substrate.

In addition, the present invention is an organic transistor device comprising: a substrate; a first electrode layer provided on a side of an upper surface of the substrate; a layered structure provided locally on a side of an upper surface of the first electrode layer, the layered structure covering an area of a predetermined size in a plan view, the layered structure including an insulation layer, an assistance electrode layer and an electric-charge-injection inhibiting layer in this order; an organic semiconductor layer provided on the side of an upper surface of the first electrode layer at least at an area not provided with the layered structure; and a second electrode layer provided on a side of an upper surface of the organic semiconductor layer.

Alternatively, the present invention is an organic transistor device comprising: a substrate; a first electrode layer provided in a predetermined pattern on a side of an upper surface of the substrate; a layered structure provided on the side of an upper surface of the substrate at an area not provided with the first electrode layer, the layered structure sandwiching the first electrode layer in a plan view, the layered structure including an insulation layer, an assistance electrode layer and an electric-charge-injection inhibiting layer in this order; an organic semiconductor layer provided at least on a side of an upper surface of the first electrode layer, and a second electrode layer provided on a side of an upper surface of the organic semiconductor layer; wherein a thickness of the first electrode layer and a thickness of the insulation layer are adjusted in such a manner that the first electrode layer is not in contact with the assistance electrode layer.

BRIEF DESCRIPTION OF THE DRAWINGS

FIGS. 3A to 3C are respectively schematic sectional views showing organic luminescence transistor devices according to other embodiments of the present invention;

BEST MODE FOR CARRYING OUT THE INVENTION

The preset invention is explained in detail based on embodiments thereof. FIGS. 1 to 9 show respective embodiments of an organic luminescence transistor device according to the present invention. The organic luminescence transistor device of the present invention is a field effect type of organic luminescence transistor device having an organic EL device structure and a vertical FET structure.

Figure 6:
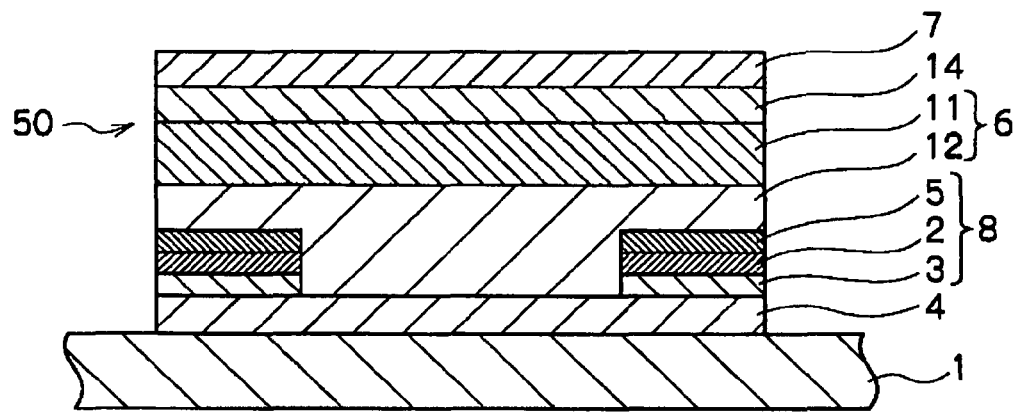
FIG. 6 is a schematic sectional view showing an organic luminescence transistor device according to another embodiment of the present invention.
Figure 7:
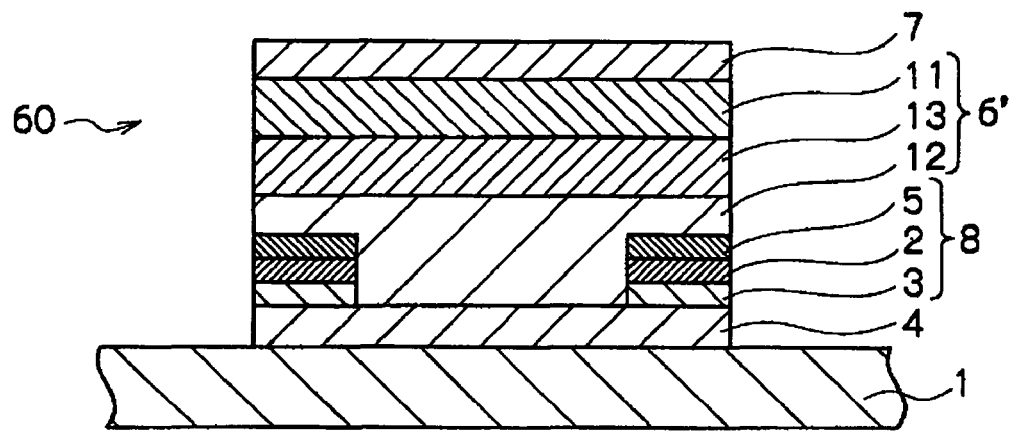
FIG. 7 is a schematic sectional view showing an organic luminescence transistor device according to another embodiment of the present invention.
Figure 8:
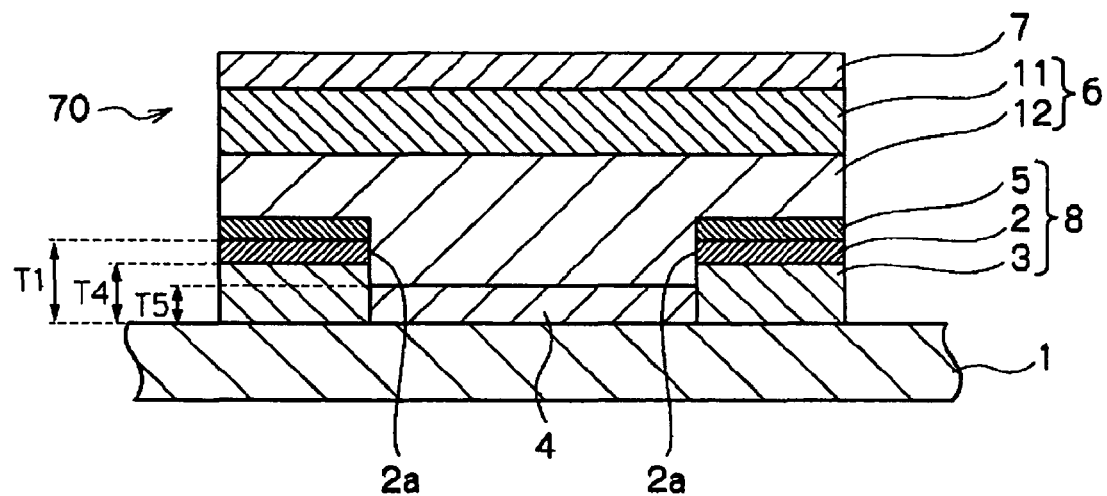
FIG. 8 is a schematic sectional view showing an organic luminescence transistor device according to another embodiment of the present invention.

The organic luminescence transistor device according to the present invention is broadly divided into a first embodiment manner as shown in FIGS. 1 to 7 and a second embodiment manner as shown in FIGS. 8 and 9, depending on structures of a first electrode (layer) 4 and a layered structure 8. However, the two embodiment manners have the same technical concept.

As shown in FIGS. 1 to 7, each organic luminescence transistor device of the first embodiment manner 10 comprises, at least, a substrate 1, a first electrode 4 provided on the substrate 1, a layered structure 8 provided on the first electrode 4 such that the layered structure 8 covers an area of a predetermined size in a plan view, an organic EL layer 6 provided on the first electrode layer 4 at least at an area not provided with the layered structure 8, and a second electrode (layer) 7 provided on the organic EL layer 6. The layered structure 8 consists of an insulation layer 3, an assistance electrode (layer) 2 and an electric-charge-injection inhibiting layer 5, which have been laminated in this order.

On the other hand, as shown in FIGS. 8 and 9, each organic luminescence transistor device of the second embodiment manner 70, 70A, 70B comprises, at least, a substrate 1, a first electrode 4 provided on the substrate 1 in a predetermined pattern, a layered structure 8 provided on the substrate 1 at an area not provided with the first electrode 4 such that the layered structure 8 sandwiches the first electrode 4 in a plan view, an organic EL layer 6 provided at least on the first electrode 4, and a second electrode 7 provided on the organic EL layer 6. The layered structure 8 consists of an insulation layer 3, an assistance electrode (layer) 2 and an electric-charge-injection inhibiting layer 5, which have been laminated in this order. In the second embodiment manner, a thickness (T5) of the first electrode 4 and a thickness of the insulation layer 3 are adjusted in such a manner that the first electrode 4 is not in contact with the assistance electrode 2. Herein, the organic EL layer 6 may be provided on the first electrode 4 only at an area not provided with the layered structure 8, or may be provided on a part or the whole of the layered structure 8 as well as the first electrode 4.

In both of the first and second embodiment manners, the organic luminescence transistor device has the layered structure 8 in which the insulation layer 3, the assistance electrode 2 and the electric-charge-injection inhibiting layer 5 have the same size in a plan view and are laminated in this order. In addition, an edge portion 2a of the assistance electrode 2 and the organic EL layer 6 are arranged to come in contact with each other.

In the organic EL layer 6, when electric charges (positive holes or electrons) injected from the first electrode (layer) 4 and the second electrode (layer) 7 are united with each other, a luminescence phenomenon occurs. In the organic luminescence transistor device 10, the assistance electrode 2 is provided at an intermediate area of the first electrode 4 and the second electrode 7, so that an amount of electric charges generated at the first electrode 4 and the second electrode 7 can be increased and decreased by changing a voltage (gate voltage VG) to be applied between the assistance electrode 2 and the first electrode 4. As a result, an amount of the luminescence can be controlled.

In addition, as shown in the drawings, the assistance electrode 2 is sandwiched between the insulation layer 3 and the electric-charge-injection inhibiting layer 5. Thus, generation and dissipation of electric charges (positive holes or electrons) are inhibited at an upper surface and a lower surface of the assistance electrode 2. Therefore, the variable voltage (gate voltage VG) at the assistance electrode 2 can give a greater effect on the amount of electric charges generated at the first electrode 4 and the second electrode 7.

This control for the amount of the luminescence can be achieved by the fact that the layered structure 8 including the assistance electrode 2 sandwiched between the insulation layer 3 and the electric-charge-injection inhibiting layer 5 is provided at the intermediate area of the first electrode 4 and the second electrode 7. For example, the first electrode 4 functions as an anode, the second electrode 7 functions as a cathode, and a constant voltage (drain voltage VD) is applied between the first electrode 4 and the second electrode 7. In this case, when a gate voltage VG is applied between the assistance electrode 2 and the first electrode 4 in such a direction that the amount of generated electric charges is increased, a flow of the positive holes (arrow 21 in FIG. 2) is enlarged (arrow 22 in FIG. 2). On the other hand, when a gate voltage VG is applied between the assistance electrode 2 and the first electrode 4 in such a direction that the amount of generated electric charges is decreased, the flow of the positive holes is diminished (arrow 23 in FIG. 2). That is, in a normally ON type of luminescence device wherein a constant voltage is applied between the first electrode and the second electrode, by the fact that the assistance electrode 2 is provided and a variable voltage is applied between the assistance electrode 2 and the first electrode 4, the amount of electric charges flowing between the first electrode and the second electrode can be controlled. Thus, luminance (brilliance) of the organic EL layer 6 can be controlled. Specifically, in a normally ON type of luminescence device wherein a constant voltage is applied between the first electrode and the second electrode, when a gate voltage VG is applied between the assistance electrode 2 and the first electrode 4 in such a direction that the amount of generated electric charges is increased, the luminance (brilliance) of the organic EL layer 6 is enhanced to become brighter. On the other hand, when a gate voltage VG is applied between the assistance electrode 2 and the first electrode 4 in such a direction that the amount of generated electric charges is decreased, the luminance (brilliance) of the organic EL layer 6 is reduced to become darker.

Furthermore, when the voltage between the first electrode and the second electrode is changed in addition to the control of the voltage between the assistance electrode and the first electrode, a large number of gradation steps of the luminance can be achieved, so that a finer image can be formed.

Regarding polarity of the electrodes, the first electrode 4 may be structured as an anode, and the second electrode 7 may be structured as a cathode. Alternatively, the first electrode 4 may be structured as a cathode, and the second electrode 7 may be structured as an anode. Whichever polarity the first electrode 4 and the second electrode 7 have respectively, the amount of the electric charges can be sensitively varied by controlling the voltage applied between the assistance electrode 2 and the first electrode 4. Thus, the electric current between the first and second electrodes can be controlled, so that the luminance (brilliance) of the organic EL layer 6 can be controlled.

Herein, when the first electrode 4 is an anode and the second electrode 7 is a cathode, the electric-charge injection layer 12 provided preferably on a side adjacent to the first electrode 4 is a positive-hole injection layer (see FIGS. 1 to 9). Then, if another electric-charge injection layer 14 (third electric-charge injection layer) adjacent to the second electrode 7 is provided (see FIG. 6), the electric-charge injection layer 14 is an electron injection layer. On the other hand, when the first electrode 4 is a cathode and the second electrode 7 is an anode, the electric-charge injection layer adjacent to the first electrode 4 is an electron injection layer. Then, if another electric-charge injection layer 14 adjacent to the second electrode 7 is provided (see FIG. 6), the electric-charge injection layer 14 is a positive-hole injection layer.

In the organic luminescence transistor device of the present invention, the important features are that the organic luminescence transistor device has the layered structure 8 in which the insulation layer 3, the assistance electrode 2 and the electric-charge-injection inhibiting layer 5 have the same size in a plan view and are laminated in this order, and that the edge portion 2$a$ of the assistance electrode 2 and the organic EL layer 6 are arranged to come in contact with each other. The other features may be variously modified. For example, the manner of the organic EL layer 6 is not specially limited, and thus various kinds of manners may be presented.

Figure 4:
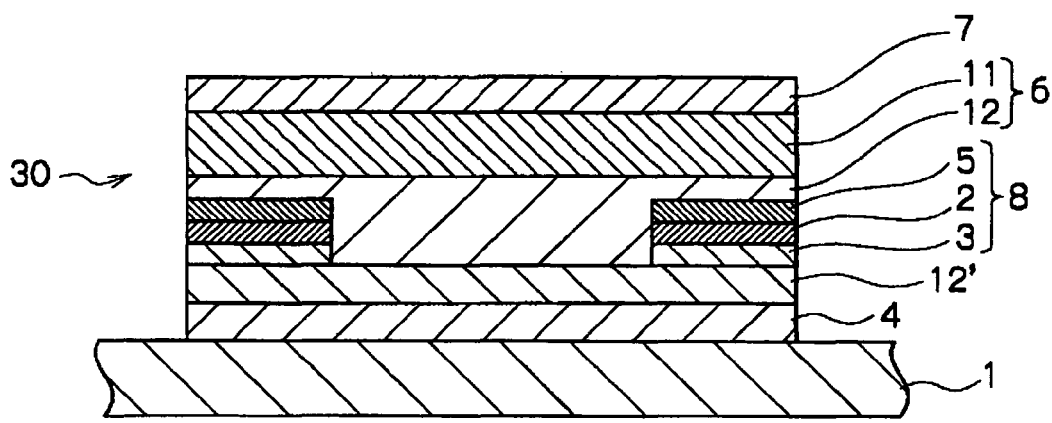
FIG. 4 is a schematic sectional view showing an organic luminescence transistor device according to another embodiment of the present invention.
Figure 5:
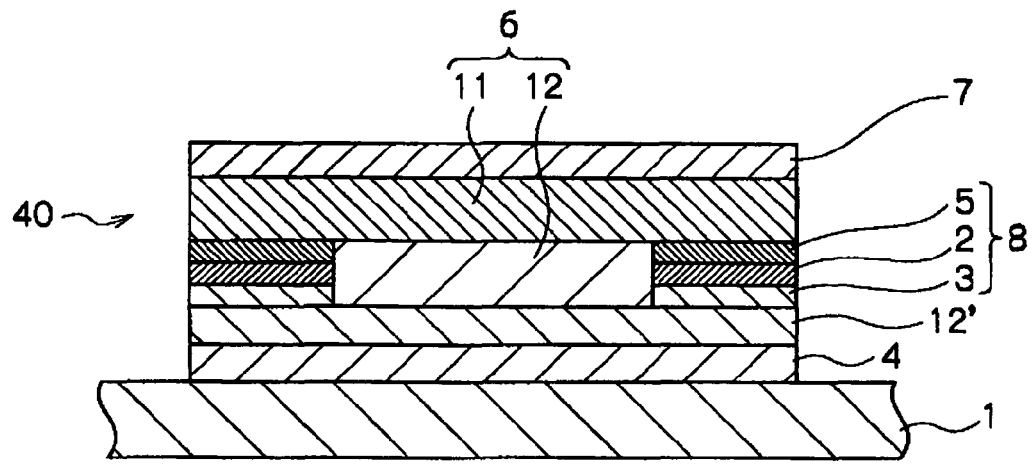
FIG. 5 is a schematic sectional view showing an organic luminescence transistor device according to another embodiment of the present invention.

Regarding the manner (form) of the organic layer 6, for example; as shown in FIGS. 1 to 3C, a two-layer structure wherein the electric-charge injection layer 12 and the luminescent layer 11 are formed in this order from the side of the first electrode 4 may be given as an example; as shown in FIGS. 4 and 5, a three-layer structure wherein the second electric-charge injection layer 12' and the electric-charge injection layer 12 and the luminescent layer 11 are formed in this order from the side of the first electrode 4 may be given as an example; as shown in FIG. 6, a three-layer structure wherein the electric-charge injection layer 12 and the luminescent layer 11 and the electric-charge injection layer 14 are formed in this order from the side of the first electrode 4 may be given as an example; as shown in FIG. 7, a three-layer structure wherein the electric-charge injection layer 12 and the electric-charge transfer layer 13 and the luminescent layer 11 are formed in this order from the side of the first electrode 4 may be given as an example. The structure of the organic EL layer 6 is not limited thereto. If required, an electric-charge transfer layer or the like may be provided. In addition, an electric-charge injection layer material and/or an electric-charge transfer layer material may be included in the luminescent layer 11, so that the single layer of the luminescent layer 11 can have functions of the electric-charge injection layer and/or the electric-charge transfer layer.

In the respective embodiments shown in FIGS. 4 and 5, as described above, the electric-charge injection layer 12' and the electric-charge injection layer 12 and the luminescent layer 11 are formed in this order from the side of the first electrode 4. That is, in the organic luminescence transistor devices 30, 40 according to these embodiments, the electric-charge injection layer 12' made of a material the same as or different from that of the electric-charge injection layer 12 is provided between the first electrode 4 and the layered structure 8/the organic EL layer 6. In the organic luminescence transistor devices 30, 40, since the electric-charge injection layer 12" is further provided on the first electrode 4 under the layered structure 8, electric charges may be generated at a surface of the layered structure 8 on the side of the first electrode 4 as well. The generated electric charges are controlled by the voltage applied between the assistance electrode 2 and the first electrode 4. Thus, the electric current between the first and second electrodes is controlled, so that the amount of the luminescence can be controlled.

Figure 1:
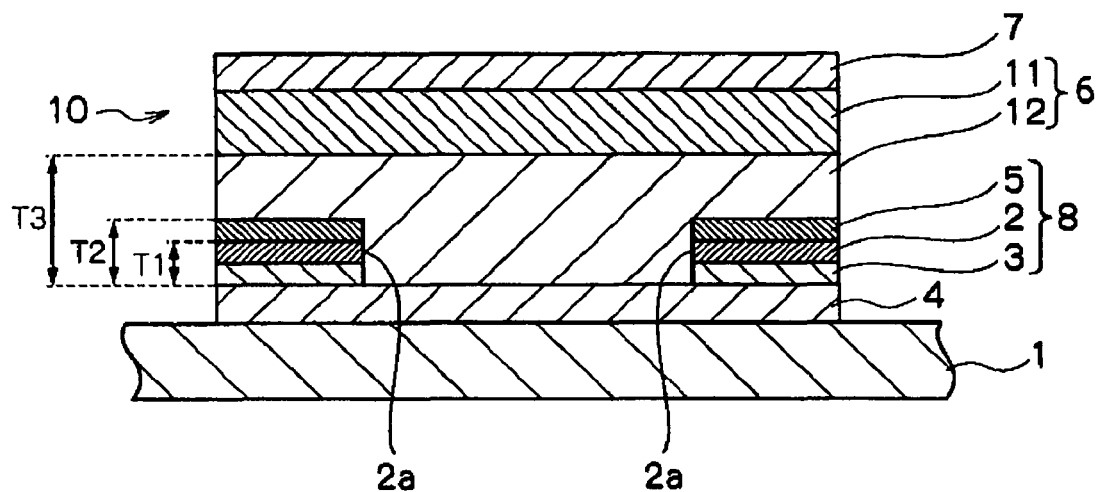
FIG. 1 is a schematic sectional view showing an organic luminescence transistor device according to an embodiment of the present invention.
Figure 2:
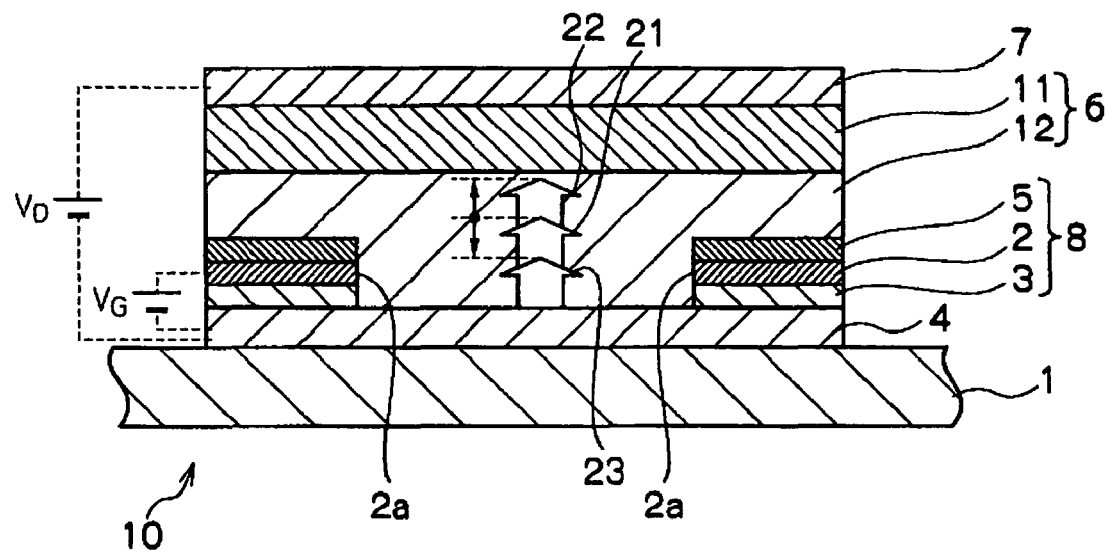
FIG. 2 is an explanatory view conceptually showing flows of electric charges in the organic luminescence transistor device of FIG. 1.

In the case wherein the organic EL layer 6 includes the electric-charge injection layer 12 and the luminescent layer 11, as shown in FIGS. 1 to 3C, a thickness of the electric-charge injection layer 12 is not specially limited. For example, (i) as shown in FIG. 1, the thickness T3 of the electric-charge injection layer 12 may be greater than the total thickness T2 of the layered structure 8 so that the electric-charge injection layer 12 covers the whole layered structure 8; (ii) as shown in FIG. 3A, the thickness T3 of the electric-charge injection layer 12 may be substantially the same as the thickness of the insulation layer 3; (iii) as shown in FIG. 3B, the thickness T3 of the electric-charge injection layer 12 may be substantially the same as the total thickness T2 of the insulation layer 3 and the assistance electrode 2; and (iv) as shown in FIG. 3C, the thickness T3 of the electric-charge injection layer 12 may be substantially the same as the total thickness T2 of the layered structure 8.

In addition, for example, as shown in FIG. 3C, when the layered structure 8 is formed to have such a thickness that the layered structure 8 comes in contact with both the first electrode 4 and the second electrode 7, the organic EL layer 6 is formed between the layered structural bodies 8, so that an matrix-patterned device can be achieved.

On the other hand, as shown in FIGS. 8 and 9, each organic luminescence transistor device of the second embodiment manner 70, 70A, 70B comprises, at least, a substrate 1, a first electrode 4 provided on the substrate 1 in a predetermined pattern, a layered structure 8 provided on the substrate 1 at an area not provided with the first electrode 4 such that the layered structure 8 sandwiches the first electrode 4 in a plan view, an organic EL layer 6 provided at least on the first electrode 4, and a second electrode 7 provided on the organic EL layer 6. The layered structure 8 consists of an insulation layer 3, an assistance electrode (layer) 2 and an electric-charge-injection inhibiting layer 5, which have been laminated in this order. In the second embodiment manner, a thickness (T5) of the first electrode 4 and a thickness of the insulation layer 3 are adjusted in such a manner that the first electrode 4 is not in contact with the assistance electrode 2.

More specifically, in the organic luminescence transistor device 70 shown in FIG. 8, the first electrode 4 on the substrate 1 is sandwiched between the opposite-side insulation layers 3, 3 in a plan view in such a manner that the first electrode 4 contacts with the opposite-sides insulation layers 3, 3. In the organic luminescence transistor device 70A shown in FIG. 9A, the first electrode 4 on the substrate 1 is sandwiched between the opposite-side insulation layers 3, 3 in a plan view in such a manner that the first electrode 4 invades the opposite-sides insulation layers 3, 3. In the organic luminescence transistor device 70B shown in FIG. 9B, the first electrode 4 on the substrate 1 is sandwiched between the opposite-side insulation layers 3, 3 in a plan view in such a manner that the first electrode 4 is not in contact with (apart from) the opposite-sides insulation layers 3, 3. That is, in the organic luminescence transistor devices of the second embodiment manner of the present invention, "the layered structure 8 provided to sandwich the first electrode (layer) 4 in a plan view" includes all the above manners. In addition, the opposite sides of the first electrode 4 may adopt different manners, respectively.

Each organic luminescence transistor device of the second embodiment manner 70, 70A, 70B is formed by patterning the first electrode 4 and the layered structure 8 on the substrate 1. More specifically, as described above, the layered structure 8 is formed "to sandwich the first electrode 4 in a plan view" on the substrate 1 at an area not provided with the first electrode 4. The other structural features are the same as those explained with reference to FIGS. 1 to 7, and thus explanation thereof is omitted. Herein, in the organic luminescence transistor devices 70, 70A, 70B of the second embodiment manner, it is necessary that the distance T4 from the surface of the substrate 1 to the upper surface of the insulation layer 3 is greater than the distance T5 from the surface of the substrate 1 to the upper surface of the first electrode 4 (T4>T5) (see FIG. 8). According to this relationship, the first electrode 4 doesn't come in contact with the assistance electrode 2, and the edge portions 2a of the assistance electrode 2 can come in contact with the organic EL layer 6 including the electric-charge injection layer 12 or an electric-charge injection material.

The organic luminescence transistor devices of the respective embodiments may be top-emission type of luminescence (Light-Emitting) transistor devices or bottom-emission type of luminescence transistor devices. Light transmittance of each layer is designed depending on which type is adopted. Each sectional view of the organic luminescence transistor device corresponds to one pixel of an organic luminescence transistor. Thus, if a luminescent layer is formed to emit a predetermined color light for each pixel, a color display or the like may be formed as a luminescent display apparatus.

<Organic Transistor Device>

Figure 10A:
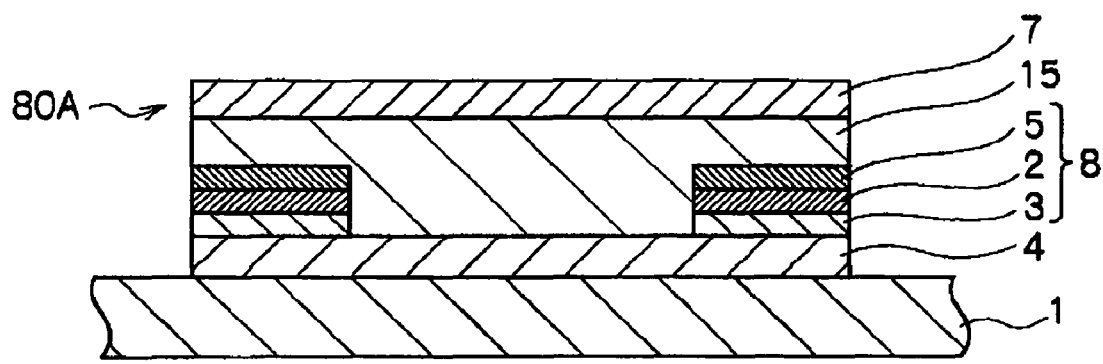
FIGS. 10A and 10B are schematic sectional views respectively showing organic transistor devices according to embodiments of the present invention.
Figure 10B:
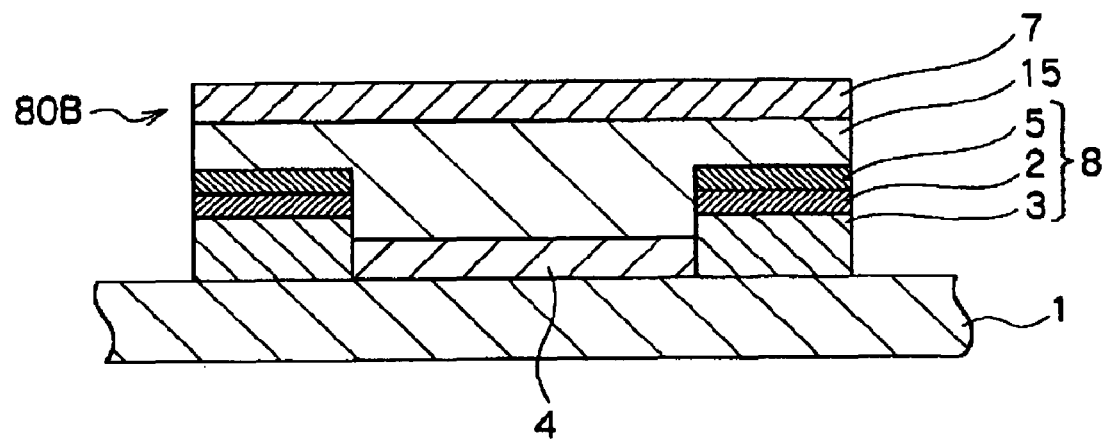

In addition, as shown in FIGS. 10A and 10B, the features of the present invention may be used for an organic transistor device.

For example, an organic transistor device of the first embodiment manner 80A shown in FIG. 10A comprises, at least, a substrate 1, a first electrode 4 provided on the substrate 1, a layered structure 8 provided on the first electrode 4 such that the layered structure 8 covers an area of a predetermined size in a plan view, an organic semiconductor layer 15 provided on the first electrode layer 4 at least at an area not provided with the layered structure 8, and a second electrode (layer) 7 provided on the organic semiconductor layer 15. The layered structure 8 consists of an insulation layer 3, an assistance electrode (layer) 2 and an electric-charge-injection inhibiting layer 5, which have been laminated in this order. In the organic transistor device 80A, the amount of electric charges flowing toward the organic semiconductor layer 15 (electric current) can be controlled.

Alternatively, an organic transistor device of the second embodiment manner 80B shown in FIG. 10B comprises, at least, a substrate 1, a first electrode 4 provided on the substrate 1 in a predetermined pattern, a layered structure 8 provided on the substrate 1 at an area not provided with the first electrode 4 such that the layered structure 8 sandwiches the first electrode 4 in a plan view, an organic semiconductor layer 15 provided at least on the first electrode 4, and a second electrode 7 provided on the organic semiconductor layer 15. The layered structure 8 consists of an insulation layer 3, an assistance electrode (layer) 2 and an electric-charge-injection inhibiting layer 5, which have been laminated in this order. In addition, a thickness of the first electrode 4 and a thickness of the insulation layer 3 are adjusted in such a manner that the first electrode 4 is not in contact with the assistance electrode 2. In the organic transistor device 80B as well, the amount of electric charges flowing toward the organic semiconductor layer 15 (electric current) can be controlled.

Herein, the organic semiconductor layer 15 may include an electric-charge injection layer and an electric-charge transfer layer, if necessary. In addition, in the examples of FIGS. 10A and 10B, the organic semiconductor layer 15 has such a thickness that the organic semiconductor layer 15 can cover the layered structure 8. In addition, in the organic transistor device of the second embodiment manner, similarly to the organic luminescence transistor device of the second embodiment manner explained with reference to FIGS. 8, 9A and 9B, "the layered structure 8 sandwiching the first electrode 4 in a plan view" includes a case wherein the first electrode 4 is in contact with and sandwiched in the layered structure 8 (insulation layer 3), a case wherein the first electrode 4 invades the layered structure 8 (insulation layer 3) to be sandwiched therein, and a case wherein the first electrode 4 is not in contact with and sandwiched in the layered structure 8 (insulation layer 3). The opposite sides of the first electrode 4 may adopt different manners, respectively.

<Structure of the Organic Luminescence Transistor Device>

Layers and electrodes included in the organic luminescence transistor devices of the respective embodiments are explained below.

The substrate 1 is not particularly limited, but may be suitably selected depending on materials or the like of layers to be laminated. For example, it may be selected from various materials such as metal, for example aluminum, glass, quartz, or resin. In the case of an organic luminescence transistor device having a bottom-emission structure, which emits light from a side of the substrate, it is preferable that the substrate is formed of a transparent or semitransparent material. On the other hand, in the case of an organic luminescence transistor device having a top-emission structure, which emits light from a side of the second electrode 7, it is not necessary to use a transparent or semitransparent material. That is, the substrate 1 may be formed of an opaque material.

More preferably, it is possible to use various materials that have been generally used as a substrate of an organic EL device. For example, depending on the application, flexible materials or rigid materials or the other may be selected. Specifically, there can be used substrates made from such materials as glass, quartz (silica), polyethylene, polypropylene, polyethylene terephthalate, polymethacrylate, polymethyl methacrylate, polymethyl acrylate, polyester, and polycarbonate.

The substrate 1 may have an individual shape or a continuous shape (a film or a SUS roll (thin SUS roll)). Specifically, a card-patterned shape, a film-like shape, a disk-like shape, and so on may be given as an example.

As electrodes, there are provided the assistance electrode 2, the first electrode 4 and the second electrode 7. As materials for the respective electrodes, a metal, a conductive oxide, a conductive polymer or the like may be used.

The first electrode 4 is provided on the substrate 1. In the first embodiment manner, on the first electrode 4, the layered structure 8 consisting of the insulation layer 3, the assistance electrode 2 and the electric-charge-injection inhibiting layer 5 is provided in a predetermined size. In the second embodiment manner, on the substrate 1 at an area not provided with the first electrode 4, the layered structure 8 consisting of the insulation layer 3, the assistance electrode 2 and the electric-charge-injection inhibiting layer 5 is provided in a predetermined size so as to sandwich the first electrode 4 from opposite sides thereof.

The predetermined size is not particularly limited. As an example, there is provided a comb-shaped layered structure 8 having a line-width of about 1 to 500 μm and a line-pitch of about 1 to 500 μm, which is described below with reference to FIG. 13. Alternatively, there may be provided a lattice-shaped layered structure 8 having a lattice-width of about 1 to 500 μm and a lattice-pitch of about 1 to 500 μm, (which is shown as layered structures 8x in the X-direction and layered structures 8y in the Y-direction in FIG. 14), which is described below with reference to FIG. 12. The shape of the layered structure 8 is not limited to the comb-like shape or the lattice-like shape, but may be various shapes such as a rhombus or a circle. The line-width and the line-pitch thereof are also not limited particularly. In addition, the line-width and/or the line-pitch may be not uniform.

The assistance electrode 2 forms a Schottky contact with the organic EL layer 6. Thus, if the organic EL layer 6 has a positive-hole injection layer or a positive-hole injection material, it is preferable to form the assistance electrode 2 from a metallic material having a small work function. On the other hand, if the organic EL layer 6 has an electron injection layer or an electron injection material, it is preferable to form the assistance electrode 2 from a metallic material having a great work function. Examples of materials useful for forming the assistance electrode 2 include single metallic materials such as aluminum and silver; magnesium alloy, such as MgAg; aluminum alloy, such as AlLi, AlCa, and AlMg; alkali metallic materials, such as Li and Ca; alkali metallic alloy, such as LiF; and other metallic materials having small work functions. In addition, when the assistance electrode 2 forms a Schottky contact with the electric-charge (positive holes or electrons) injection layer, there can be used electrically-conductive transparent films such as films of ITO (indium tin oxide), indium oxide, IZO (indium zinc oxide), SnO2, and ZnO; metallic materials having great work functions, such as gold and chromium; and electrically-conductive polymers such as polyaniline, polyacetylene, polyalkylthiophene derivatives, and polysilane derivatives.

Examples of materials useful for forming the first electrode 4 or the second electrode 7 as a cathode include single metallic materials such as aluminum and silver; magnesium alloy, such as MgAg; aluminum alloy, such as AlLi, AlCa, and AlMg; alkali metallic materials, such as Li and Ca; alkali metallic alloy, such as LiF; and other metallic materials having small work functions.

On the other hand, examples of materials useful for forming the first electrode 4 or the second electrode 7 as an anode include, among the electrode-forming materials useful for the auxiliary electrode 2 and for the above-described cathode, metals that produce "ohmic contact" with some material of the organic EL layer 6 (the electric-charge injection layer 12 or the luminescent layer 11) in contact with the anode. Preferred examples of such materials include metallic materials having great work functions, such as gold and chromium; electrically-conductive transparent films such as films of ITO (indium tin oxide), indium oxide, IZO (indium zinc oxide), SnO2, and ZnO; and electrically-conductive polymers such as polyaniline, polyacetylene, polyalkylthiophene derivatives, and polysilane derivatives.

The first electrode 4 is provided on the side of the upper surface of the substrate 1. A barrier layer and/or a smoothing layer may be provided between the substrate 1 and the first electrode 4.

The assistance electrode 2 is provided on the insulation layer 3, which has been provided on the first electrode 4 or the substrate 1 in a predetermined shape, in the same shape as the insulation layer 3 in a plan view. Herein, the "same shape" includes not only a case wherein the shapes are completely the same, but also a case wherein the shapes are alike enough to produce a common effect. The second electrode 7 is provided to sandwich the organic EL layer 6 between the second electrode 7 and the first electrode 4.

Each of the assistance electrode 2, the first electrode 4 and the second electrode 7 may be a single-layered electrode made of any of the above materials, or a multi-layered electrode made of a plurality of the above materials.

Herein, as described below, when a photosensitive material that becomes removable by photoirradiation is used as a material for the electric-charge-injection inhibiting layer 5, a material that doesn't transmit an exposure wavelength of the photosensitive material is preferably used as a material for the assistance electrode 2, and a material that transmits the exposure wavelength of the photosensitive material is preferably used as a material for the first electrode 4. The thickness of each electrode is not limited, but usually within a range of 10 to 1000 nm.

When the organic luminescence transistor device is a bottom-emission type, it is preferable that the electrodes located below the luminescent layer 11 are transparent or semitransparent. On the other hand, when the organic luminescence transistor device is a top-emission type, it is preferable that the electrodes located above the luminescent layer 11 are transparent or semitransparent. As a transparent electrode material, any of the above electrically-conductive transparent films, thin metallic films, and electrically-conductive polymer films may be used. Herein, the "below" and the "above" are defined in a vertical direction in the plane of the drawings. The opposite sides (light side, left side) are defined in a transversal direction in the plane of the drawings.

The above respective electrodes are formed by a vacuum process such as vacuum deposition, sputtering or CVD, or a coating process. The thickness (film thickness) of each electrode depends on the material used for the electrode. For example, it is preferable that the thickness is within a range of about 10 nm to about 1000 nm. Herein, when an electrode is formed on the organic EL layer 6 such as the luminescent layer 11 and/or the electric-charge injection layer 12, a protecting layer (not shown) may be provided on the organic EL layer 6, in order to reduce damage of the organic EL layer 6 at the formation of the electrode. The protection layer may be provided before the electrode is formed, in a case wherein the electrode is formed on the organic EL layer 6 by a sputtering method or the like. For example, a vacuum deposition film or a sputtering film is preferably formed by a semitransparent film made of Au, Ag, Al, or the like, or by an inorganic semiconductor film made of ZnS, ZnSe, or the like, which scarcely gives damage to the organic EL layer 6 when the film is formed. The thickness of the protection layer is preferably within a range of about 1 to about 500 nm.

The insulating layer 3 is provided on the first electrode 4 (first embodiment manner) or the substrate 1 (second embodiment manner) at a predetermined area in a predetermined size/shape. The predetermined size is not particularly limited. As described above, there may be provided a comb-shaped insulation layer 3 having a line-width of about 1 to 500 μm and a line-pitch of about 1 to 500 μm, or a lattice-shaped insulation layer 3 having a lattice-width of about 1 to 500 μm and a lattice-pitch of about 1 to 500 μm. The shape of the insulation layer 3 is not limited to the comb-like shape or the lattice-like shape, but may be various shapes such as a rhombus or a circle. The line-width and the line-pitch thereof are also not limited particularly. In addition, the line-width and/or the line-pitch may be not uniform.

For example, the insulating layer 3 can be formed from an inorganic material such as $SiO_2$, $SiN_x$ or $Al_2O_3$, an organic material such as polychloroprene, polyethylene terephthalate, polyoxymethylene, polyvinyl chloride, polyvinylidene fluoride, cyanoethyl pullulan, polymethyl methacrylate, polyvinyl phenol, polysulfone, polycarbonate or polyimide, or a commercially available resist material that is commonly used in this field. The insulation film 3 may be a single-layered insulation film made of any of the above materials, or a multi-layered insulation film made of a plurality of the above materials. Herein, as described below, when a photosensitive material that becomes removable by photoirradiation is used as a material for the electric-charge-injection inhibiting layer 5, a material that transmits the exposure wavelength of the photosensitive material is preferably used as a material for one or both of the insulation layer 3 and the assistance electrode layer 2 provided on the insulation layer 3 in the same size.

In particular, in the present invention, in view of manufacturing cost and/or manufacturing easiness, it is preferable to use a resist material commonly used in this field. A predetermined pattern may be formed by a screen printing method, a spin coating method, a cast method, a Czochralski method, a decalcomania method, an ink-jetting method, a photolithography method, or the like. The insulation film 3 made of the above inorganic material may be formed by an existing patterning process such as a CVD. It is preferable that the thickness of the insulation film 3 is thinner. However, if the thickness is too thin, leakage electric current between the assistance electrode 2 and the first electrode 4 tends to become great. Thus, the thickness is usually within a range of about 10 nm to 500 nm.

When the organic luminescent transistor device is the bottom-emission type, the insulation film 3 is located below the luminescent layer 11. Thus, the insulation film 3 is preferably transparent or semitransparent. On the other hand, when the organic luminescent transistor device is the top-emission type, it is unnecessary that the insulation film 3 is transparent or semitransparent.

The electric-charge-injection inhibiting layer 5 is provided on the assistance electrode 2, in the same size as the assistance electrode 2 in a plan view. When a voltage is applied between the first electrode 4 and the assistance electrode 2, the electric-charge-injection inhibiting layer 5 functions to inhibit the flow of the electric charges (positive holes or electrons) generated at the upper surface of the assistance electrode 2, which is opposite to the second electrode 7, toward the second electrode 7.

In the present invention, since the electric-charge-injection inhibiting layer 5 is provided on the upper surface of the assistance electrode 2 in the same shape in a plan view, when a voltage is applied between the first electrode 4 and the assistance electrode 2, the electric charges (flow of the electric charges) are mainly generated at the edge portion 2a, which has only a small area and is not covered by the electric-charge-injection inhibiting layer 5. The amount of the generated electric charges (flow of the electric charges) at the edge portion 2a of the assistance electrode 2 is controlled by the gate voltage VG applied between the assistance electrode 2 and the first electrode 4. In addition, the electric charges (flow of the electric charges) generated at the edge portion 2a moves toward the second electrode 7 or the first electrode 4, which depends on the polarity of the electric charges, by means of the drain voltage VD applied between the first electrode 4 and the second electrode 7. As a result, the moved electric charges are added to the electric charges generated by the application of the voltage between the first electrode 4 and the second electrode 7, so that the total amount of the electric charges is changed. On the other hand, the electric charges are generated at the first electrode 4 as well, and they are also added to the electric charges generated by the application of the voltage between the first electrode 4 and the second electrode 7, so that the total amount of the electric charges is changed.

If the polarity of the electric charges generated between the first electrode 4 and the assistance electrode 2 is the same as the polarity of the electric charges generated between the first electrode 4 and the second electrode 7, the total amount of the electric charges is changed to be increased. On the other hand, if the polarity is opposite, the total amount of the electric charges is changed to be decreased. That is, in a normally ON type of luminescence device wherein a constant voltage is applied between the first electrode and the second electrode, when a gate voltage VG is applied between the assistance electrode 2 and the first electrode 4 in such a direction that the amount of generated electric charges is increased, the luminance (brilliance) of the organic EL layer 6 is enhanced to become brighter. On the other hand, when a gate voltage VG is applied between the assistance electrode 2 and the first electrode 4 in such a direction that the amount of generated electric charges is decreased, the luminance (brilliance) of the organic EL layer 6 is reduced to become darker. Furthermore, when the voltage between the first electrode 4 and the second electrode 7 is changed in addition to the control of the voltage between the assistance electrode 2 and the first electrode 4, a large number of gradation steps of the luminance can be achieved, so that a finer image can be formed.

The electric-charge-injection inhibiting (suppression) layer 5 can be formed from any of a variety of materials, as long as it can exhibit the above-described effects. Examples of films useful for the electric-charge-injection inhibiting (suppression) layer 5 include inorganic or organic insulating films. For example, the electric-charge-injection inhibiting (suppression) layer 5 may be a film of an inorganic insulating material such as $SiO_2$, $SiN_x$ or $Al_2O_3$, or of a conventional organic insulating material such as polychloroprene, polyethylene terephthalate, polyoxymethylene, polyvinyl chloride, polyvinylidene fluoride, cyanoethyl pullulan, polymethyl methacrylate, polyvinyl phenol, polysulfone, polycarbonate or polyimide. The electric-charge-injection inhibiting (suppression) layer 5 may be a single-layered electric-charge-injection inhibiting layer made of any of the above materials, or a multi-layered electric-charge-injection inhibiting layer made of a plurality of the above materials. The electric-charge-injection inhibiting layer 5 is formed by a vacuum process such as vacuum deposition, sputtering or CVD, or a coating process. The thickness of the electric-charge-injection inhibiting layer 5 depends on the material used for the electric-charge-injection inhibiting layer 5. For example, it is preferable that the thickness is within a range of about 0.001 µm to about 10 µm.

It is preferable that the electric-charge-injection inhibiting layer 5 is made of an insulation material which is easily available, easily formable, and easily capable of precisely patterning. In particular, it is preferable to use a film made of a photosensitive material that becomes removable by photoirradiation, more specifically a positive-type resin film. When a positive-type photosensitive material is used as a material for the electric-charge-injection inhibiting layer 5, the photosensitive material is provided on or above the whole upper surface of the first electrode 4 so as to cover the assistance electrode 2, and then is exposed to light from a side of the substrate 1. Thus, only the positive-type photosensitive material provided directly on the first electrodes 4 may be removed easily and precisely. As a result, the electric-charge-injection inhibiting layer 5 having the same size as the assistance electrode 2 in a plan view may be formed on the assistance electrode 2 accurately in dimension.

As described above, the organic EL layer 6 includes, at least, the electric-charge injection layer 12 and the luminescent layer 11. Alternatively, the organic EL layer 6 may include a luminescent layer 11 including at least an electric-charge injecting material. As long as these requirements are satisfied, the organic EL layer 6 is not particularly limited. That is, the above respective manners may be adopted. Each layer as a component of the organic layer 6 is formed in a suitable thickness (for example, within a range of 0.1 nm to 1 µm), depending on a structure of the device and/or a kind of the material. Herein, if the thickness of each layer of the organic EL layer 6 is too large, a large voltage may be necessary in order to obtain a predetermined light emission, which is inferior in light-emission efficiency. On the other hand, if the thickness of each layer of the organic EL layer 6 is too small, a pinhole or the like may be generated, which results in insufficient luminance (brightness) when the electric field is applied.

Any material that is commonly used as a luminescent layer in an organic EL device is useful for the luminescent layer 11. For example, a pigment luminescent material, a metal complex luminescent material, a polymer luminescent material, or the like may be used.

Examples of luminescent pigments include cyclopentadiene derivatives, tetraphenyl butadiene derivatives, triphenylamine derivatives, oxadiazole derivatives, pyrazoloquinoline derivatives, distyrylbenzene derivatives, distyrylarylene derivatives, silol derivatives, thiophene cyclic compounds, pyridine cyclic compounds, perinone derivatives, perylene derivatives, oligothiophene derivatives, trifumanylamine derivatives, oxadiazole dimers, and pyrazoline dimers. Examples of luminescent metal complexes include alumiquinolinol complexes, benzoquinolinol beryllium complexes, benzoxazole zinc complexes, benzothiazole zinc complexes, azomethyl zinc complexes, porphyrin zinc complexes, and europium complexes. Other examples of luminescent metal complexes include metal complexes having, as a central metal, such a metal as Al, Zn or Be, or a rare earth metal such as Tb, Eu or Dy, and, as a ligand, oxadiazole, thiadiazole, phenylpyridine, phenylbenzoimidazole, or quinoline structure. Examples of luminescent polymers include polyparaphenylene vinylene derivatives, polythiophene derivatives, polyparaphenylene derivatives, polysilane derivatives, polyacetylene derivatives, polyvinyl carbazole, polyfluorenone derivatives, polyfluorene derivatives and polyquinoxaline derivatives, and copolymers of these derivatives.

Additives such as a dopant may be added to the luminescent layer 11 for the purpose of improving light emission efficiency or of changing emission wavelength. Examples of dopants useful herein include perylene derivatives, coumarin derivatives, rubrene derivatives, quinacridone derivatives, squaleum derivatives, porphyrin derivatives, styryl dyes, tetracene derivatives, pyrazoline derivatives, decacyclene, phenoxazone, quinoxaline derivatives, carbazole derivatives, and fluorene derivatives.

Examples of materials useful for forming the electric-charge injection layer 12 include the compounds enumerated above as examples of luminescent materials. Other materials useful for the electric-charge injection layer 12 include phenylamines, starburst amines, phthalocyanines, polyacenes, oxides such as vanadium oxide, molybdenum oxide, ruthenium oxide and aluminum oxide, and derivatives of amorphous carbon, polyaniline, polythiophene, etc.

An electric-charge injection layer 14 for the second electrode (see FIG. 6) may be formed on the luminescent layer 11 side of the second electrode 7. Examples of materials that can be used to form the electric-charge (electron) injection layer 14 when the second electrode 7 serves as a cathode include the compounds described above as examples of luminescent materials for the luminescent layer 11, as well as alkaline metals, halides of alkaline metals, organic complexes having alkaline metals, and so on, such as aluminum, lithium fluoride, strontium, magnesium oxide, magnesium fluoride, strontium fluoride, calcium fluoride, barium fluoride, aluminum oxide, strontium oxide, calcium, polymethyl methacrylate polystyrene sodium sulfonate, lithium, cesium, and cesium fluoride.

Examples of materials that can be used to form the electric-charge (hole) transfer layer 13 (see FIG. 7) when the first electrode 4 serves as an anode include those materials that are commonly used as positive-hole transfer materials, such as phthalocyanine, naphthalocyanine, porphyrin, oxadiazole, triphenylamine, triazole, imidazole, imidazolone, pyrazoline, tetrahydroimidazole, hydrazone, stilbene, pentacene, polythiophene and butadiene, and derivatives of these compounds. It is also possible to use poly(3,4)ethylenedioxythiophene/polystyrene sulfonate (abbreviation: PEDOT/PSS, manufactured by BAYER AG., trade name: Baytron P AI4083, sold as an aqueous solution) and the like, commercially available as materials useful for forming the electric-charge transfer layer 13. An electric-charge-transfer-layer-forming coating liquid containing any of the above-enumerated compounds is used to form the electric-charge transfer layer 13. The electric-charge transfer material may be incorporated into the luminescent layer 11 or into the electric-charge injection layer 12.

Further, although not shown in the figures, an electric-charge transfer layer may be formed on the second electrode 7 side of the luminescent layer 11. Examples of materials that can be used to form this electric-charge (electron) transfer layer when the second electrode 7 serves as a cathode include those materials that are commonly used as electron transfer materials, such as anthraquinodimethane, fluorenylidene methane, tetracyanoethylene, fluorenone, diphenoquinone oxadiazole, anthrone, thiopyrane dioxide, diphenoquinone, benzoquinone, maronontrile, dinitrobenzene, nitroanthraquinone, maleic anhydride, and perylene tetracarboxylic acid, and derivatives of these compounds. An electric-charge-transfer-layer-forming coating liquid containing any of the above-enumerated compounds is used to form the electric-charge (electron) transfer layer. The electric-charge transfer material may be incorporated into the luminescent layer 11 or into the charge injection layer 12.

A luminescent material or electric-charge transfer/injection material, such as an oligomeric or dendrimeric material, can be incorporated in the organic EL layer composed of the luminescent layer 11, the charge injection layer 12, the electric-charge transfer layer 13, etc., as needed. To form each layer constituting the organic EL layer, a vacuum deposition process is used. Alternatively, a coating liquid prepared by dissolving or dispersing the material for forming each layer in such a solvent as toluene, chloroform, dichloromethane, tetrahydrofuran, or dioxane is applied with an applicator or the like, or is printed, to form each layer.

As described above, the organic EL layer 6 is formed by the luminescent-layer forming material, the electric-charge-injection-layer forming material, electric-charge-transfer-layer forming material, and/or the like, depending on the respective layered (laminated) manners. Herein, the organic EL layer 6 is divided by partitions (not shown), and formed at each predetermined position. The partitions (not shown) form areas divided for respective emission colors in the plane of the luminescent display apparatus including the organic luminescent transistor device. As a material for the partitions, any conventional material that is commonly used as a partition material may be used, for example a photosensitive resin, an active energy beam curable resin, a heat curable resin, a thermoplastic resin or the like. As a forming method of the partitions, a suitable method for the adopted partition material is adopted. For example, a thick-film printing method or a patterning method to a photosensitive resin may be used to form the partitions.

In the embodiment shown in FIG. 3C, the electric-charge-injection inhibiting layer 5 is thickened to come in contact with the second electrode 7. In the case, the laminated structure 8 consisting of the insulation layer 3, the assistance electrode 2 and the electric-charge-injection inhibiting layer 5 serves as the partition. In the other embodiments, the layered structure 8 is formed to be thin not to come in contact with the second electrode 7, for example as shown in FIG. 3A. Thus, light emitting parts are formed by providing respective color luminescent layers for the areas surrounded (divided) by the partitions (not shown).

<Manufacturing Method of the Organic Luminescence Transistor Device>

Figure 11A:
FIGS. 11A to 11F are flow charts showing a manufacturing method of an organic luminescence transistor device according to an embodiment of the present invention.
Figure 11B:
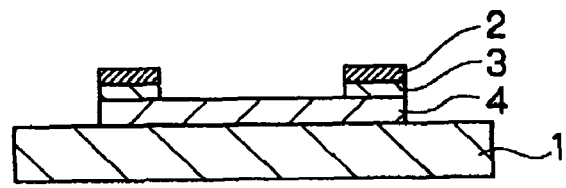
Figure 11C:
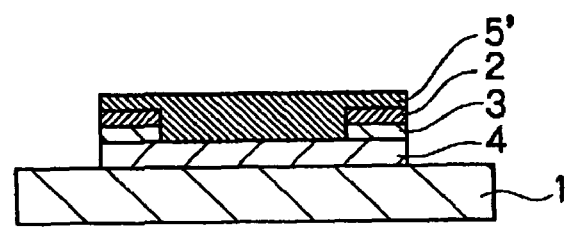
Figure 11D:
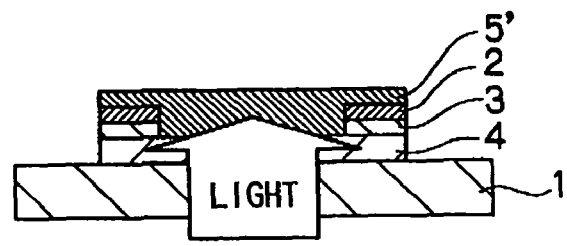
Figure 11E:
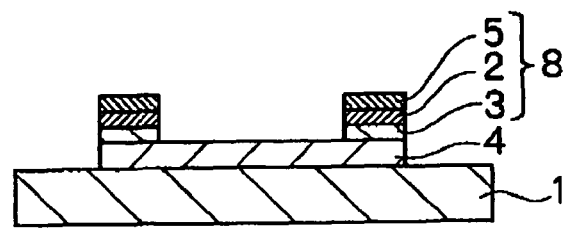
Figure 11F:
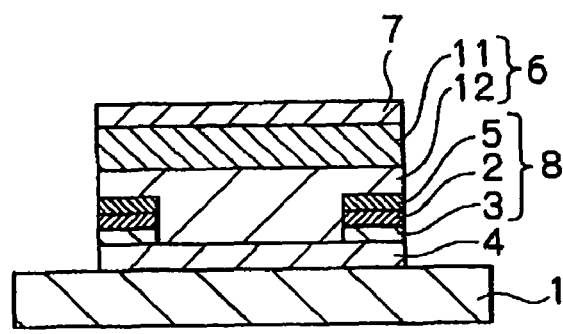
Figure 12A:
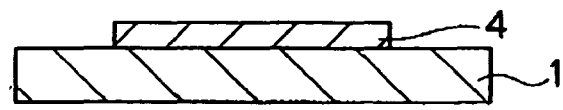
FIGS. 12A to 12F are flow charts showing a manufacturing method of an organic luminescence transistor device according to another embodiment of the present invention.
Figure 12B:
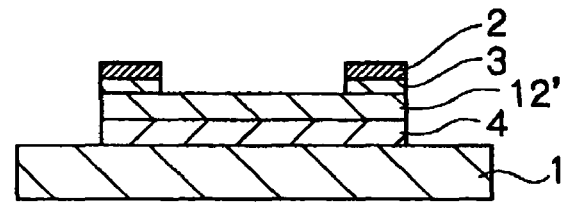
Figure 12C:
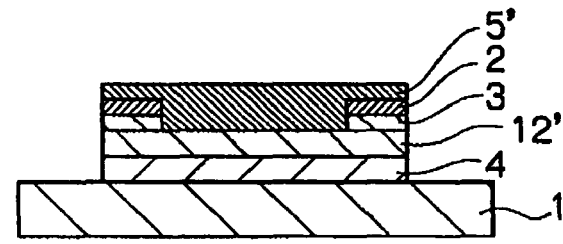
Figure 12D:
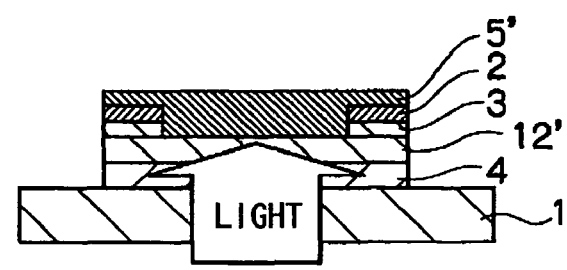
Figure 12E:
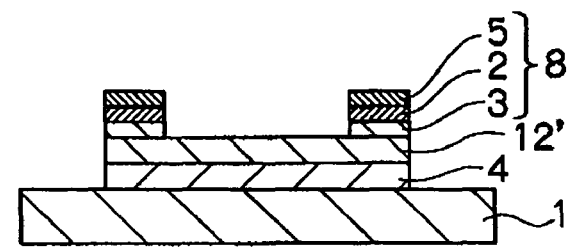
Figure 12F:
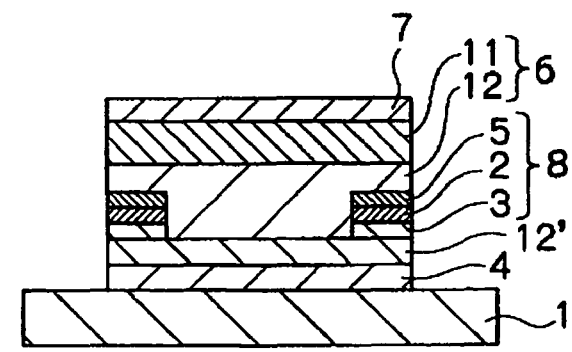

Next, embodiments of a manufacturing method of an organic luminescence transistor device according to the present invention are explained. FIGS. 11A to 11F are flow charts showing a manufacturing method of an organic luminescence transistor device according to an embodiment of the first embodiment manner of the present invention;

The manufacturing method of an organic luminescence transistor device according to the present embodiment comprises, at least, the steps of: preparing a substrate 1 on which a first electrode 4 has been formed (see FIG. 11A); providing a layered structure 8 locally on the first electrode 4 such that the layered structure 8 has a predetermined size, the layered structure 8 including an insulation layer 3, an assistance electrode layer 2 and an electric-charge-injection inhibiting layer 5 laminated in this order (see FIGS. 11B to 11E); providing an organic EL layer 6 on the first electrode 4 at an area not provided with the layered structure 8 (see FIG. 11F); and providing a second electrode 7 on the organic EL layer 6 (see FIG. 11F).

Among the above steps, in the step of providing the layered structure 8 on the first electrode 4, (i) the insulation layer 3, the assistance electrode 2 and the electric-charge-injection inhibiting layer 5 may be directly patterned by means of a mask deposition process, respectively. Alternatively, (ii) as shown in FIGS. 11C to 11E, if a photosensitive material (positive-type resist) that becomes removable by photoirradiation is used as a material for the electric-charge-injection inhibiting layer 5; a material that doesn't transmit an exposure wavelength of the photosensitive material is used as a material for one or both of the insulation layer 3 and the assistance electrode layer 2 provided on the insulation layer 3 in the same size; and a material that transmit the exposure wavelength of the photosensitive material is used as a material for the first electrode 4, after the photosensitive material is provided so as to cover a laminated structure consisting of the insulation layer 3 and the assistance electrode 2, the photosensitive material is exposed to light from a side of the substrate 1, so that only the positive-type photosensitive material provided directly on the first electrode 4 may be removed. As a result, the layered structure 8 wherein the positive-type photosensitive material is provided only on the laminated structure may be formed easily and precisely.

The material that doesn't transmit the exposure wavelength of the photosensitive material includes a metal such as Al, Au, Cr, Pt and Ti, and a transparent electrode made of ITO or IZO whose upper surface or lower surface is laminated with Au, Al or the like. In addition, the assistance electrode 2 may include at least one layer made of any of Au, Cr, Pt, Ti, ITO and IZO.

That is, as shown in FIG. 11C, the positive-type resist 5' is provided on the first electrode 4 so as to cover the assistance electrode 2. Thereafter, as shown in FIG. 11D, light of an exposure wavelength of the positive-type resist 5' is irradiated to the positive-type resist 5' from a side of the substrate 1, so that the positive-type resist 5' provided on the first electrode 4 is exposed to the light. Then, as shown in FIG. 11E, the exposed positive-type resist 5' is developed, so that only the positive-type resist 5' provided directly on the first electrode 4 is removed. Thus, the electric-charge-injection inhibiting layer 5 may be formed on the assistance electrode 2 such that the electric-charge-injection inhibiting layer 5 has the same size as the assistance electrode 2 in a plan view.

FIGS. 11A to 11F correspond to a manufacturing method of an organic luminescence transistor device 10 shown in FIG. 1. However, the organic luminescence transistor devices shown in FIGS. 3A to 3C may be manufactured in the same manner.

When the organic luminescence transistor device 20A shown in FIG. 3A is manufactured, the electric-charge injection layer 12 is formed by a patterning process such as a mask deposition process or an ink-jetting method, in such a manner that the thickness T3 of the electric-charge injection layer 12 is substantially the same as the thickness of the insulation layer 3. Thereafter, the luminescent layer 11 is formed to uniformly cover the upper surface of the electric-charge injection layer 12 and the upper surface of the electric-charge-injection inhibiting layer 5.

When the organic luminescence transistor device 20B shown in FIG. 3B is manufactured, the electric-charge injection layer 12 is formed by a patterning process such as a mask deposition process or an ink-jetting method, in such a manner that the thickness T3 of the electric-charge injection layer 12 is substantially the same as the total thickness of the insulation layer 3, the assistance electrode 2 and the electric-charge-injection inhibiting layer 5 (the total thickness of the layered structure 8). Thereafter, the luminescent layer 11 is formed to uniformly cover the upper surface of the electric-charge injection layer 12 and the upper surface of the electric-charge-injection inhibiting layer 5.

When the organic luminescence transistor device 20C shown in FIG. 3C is manufactured, the electric-charge injection layer 12 is formed by a patterning process such as a mask deposition process or an ink-jetting method, in such a manner that the thickness T3 of the electric-charge injection layer 12 is substantially the same as the thickness of the laminated structure consisting of the insulation layer 3 and the assistance electrode 2. Thereafter, the luminescent layer 11 is formed by a patterning process such as a mask deposition process or an ink-jetting method, in such a manner that the total thickness of the electric-charge injection layer 12 and the luminescent layer 11 doesn't exceed but becomes substantially the same as the total thickness of the layered structure 8.

In the manufacturing method for the organic luminescent transistor devices shown in FIGS. 3A to 3C, as described above, when each layer included in the organic EL layer 6 is formed of a low-molecular material, it is preferable that the pattern formation is carried out by a mask deposition method or the like, and when each layer included in the organic EL layer 6 is formed of a polymer (high-molecular) material, it is preferable that the pattern formation is carried out by an ink-jetting method or the like. By means of such a method, the organic EL layer 6 may be formed between adjacent layered structures 8, 8, to form a device. In addition, as shown in FIG. 3C, organic EL layers 6 may be formed between adjacent layered structures 8, to form a matrix-patterned device.

FIGS. 12A to 12F are flow charts showing an example of a manufacturing method of an organic luminescence transistor device shown in FIG. 4. In the present manufacturing method, as shown in FIGS. 12A to 12F, before the step of providing the insulation layer 3, a step of providing a second electric-charge injection layer 12' made of the same material as or a different material from the electric-charge injection layer 12 on the upper surface of the first electrode 4 is conducted. The other features are the same as the manufacturing method shown in FIGS. 11A to 11F. The explanation of the same steps is omitted.

As described in the explanation regarding FIGS. 11A to 11F, for the step of removing only the positive-type resist provided on the first electrode 4 by exposing the positive-type resist to light from a side of the substrate 1, it is preferable that the second electric-charge injection layer 12' formed in advance on the first electrode 4 is made of a material that transmits an exposing wavelength of the positive-type resist.

Figure 9A:
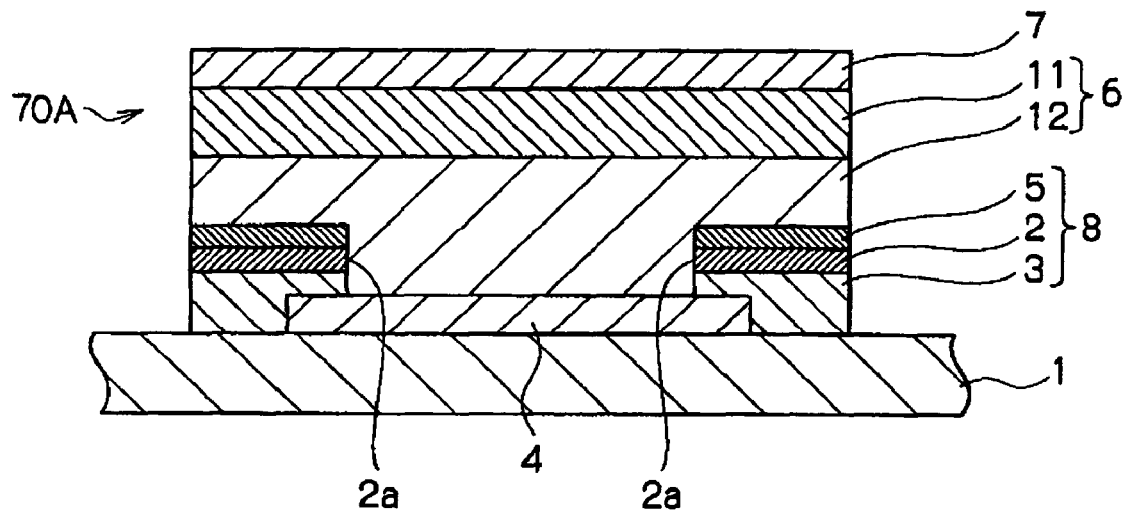
FIGS. 9A and 9B are schematic sectional views respectively showing organic luminescence transistor devices according to other embodiments of the present invention.
Figure 9B:
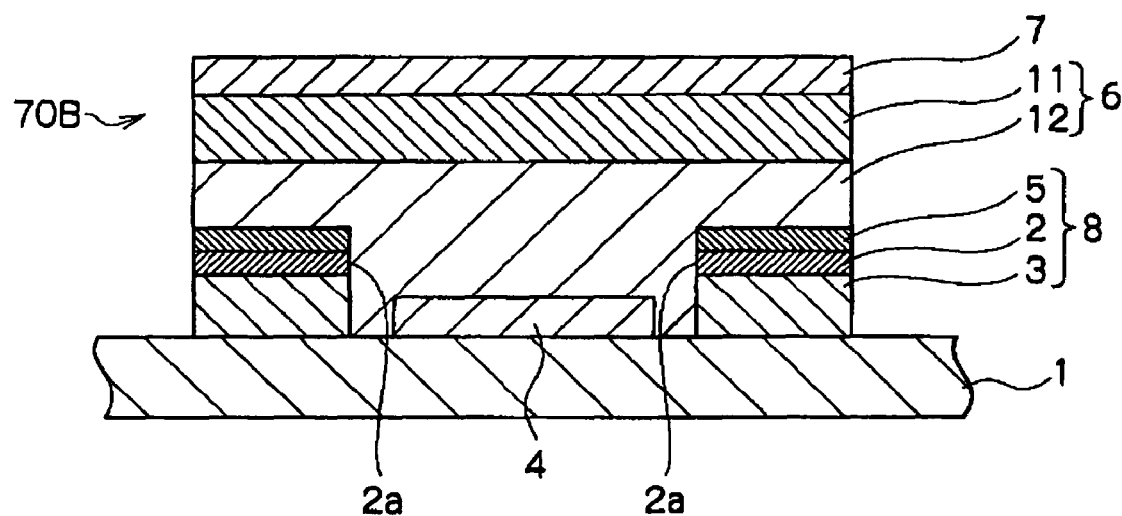

The manufacturing method of an organic luminescence transistor device according to the second embodiment manner of the present embodiment (organic luminescence transistor devices 70, 70A, 70B as shown in FIGS. 8, 9A and 9B) comprises, at least, the steps of: preparing a substrate 1 on which a first electrode 4 has been formed in a predetermined pattern; providing a layered structure 8 on a side of an upper surface of the substrate 1 at an area not provided with the first electrode 4 such that the layered structure 8 has a predetermined size and sandwiches the first electrode 4 in a plan view, the layered structure 8 including an insulation layer 3, an assistance electrode 2 and an electric-charge-injection inhibiting layer 5 in this order; providing an organic EL layer 6 on a side of an upper surface of the first electrode 4; and providing a second electrode 7 on a side of an upper surface of the organic EL layer 6. In addition, the manufacturing method is characterized in that a thickness of the first electrode 4 and a thickness of the insulation layer 3 are adjusted in such a manner that the first electrode 4 is not in contact with the assistance electrode 2. The manufacturing method of an organic luminescence transistor device according to the second embodiment manner is different from the manufacturing method of an organic luminescence transistor device according to the first embodiment manner, in that the layered structure 8 is formed on the substrate 1 at an area not provided with the first electrode 4 so as to sandwich the first electrode 4 in a plan view. However, the other steps are common.

Organic luminescent transistor devices shown in FIGS. 5 to 7 and an organic transistor device shown in FIG. 10 may be also manufactured through substantially the same steps as the above steps.

According to the above manufacturing method, when the electric-charge-injection inhibiting layer 5 is formed on the laminated structure consisting of the insulation layer 3 and the assistance electrode 2, the positive-type photosensitive material is provided so as to cover the laminated structure and then is exposed to light from a side of the substrate 1. Thus, only the positive-type photosensitive material provided between the laminated structures may be removed easily and precisely.

<Organic Luminescence Transistor and Luminescence Display Apparatus>

Next, embodiments of an organic luminescence transistor and a luminescence display apparatus are explained. The present invention is not limited by the following explanation.

In the organic luminescence transistor of the present embodiment, a plurality of organic luminescence transistor devices is arranged in a matrix pattern on a sheet-like substrate. The organic luminescence transistor of the present embodiment comprises: the plurality of organic luminescence transistor devices, a first voltage-feeding unit configured to apply a constant voltage (drain voltage VD) between the first electrode 4 and the second electrode 7 of each organic luminescence transistor device, and a second voltage-feeding unit configured to apply a variable voltage (gate voltage VG) between the first electrode 4 and the assistance electrode 2 of each organic luminescence transistor device.

Figure 13:
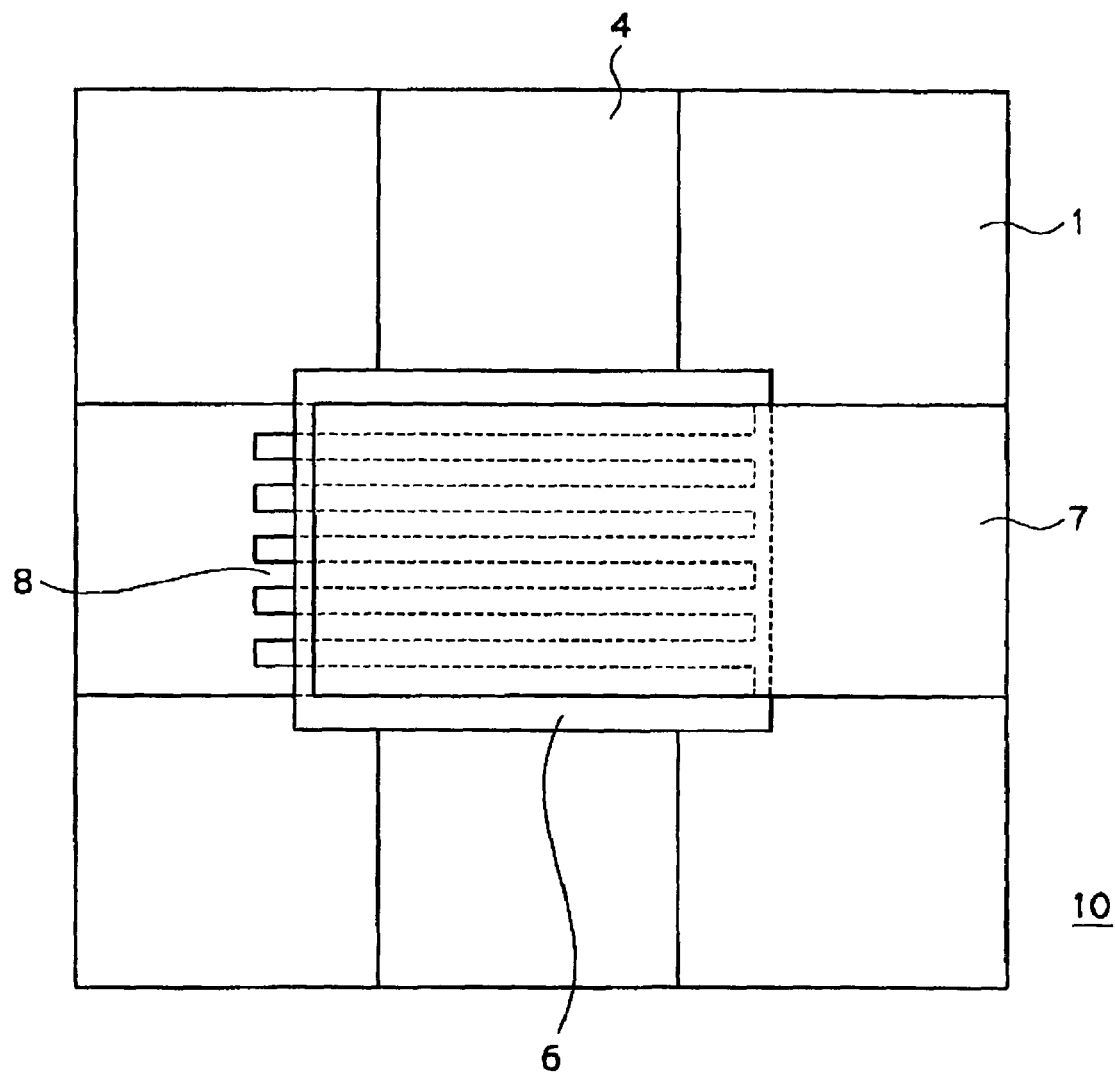
FIG. 13 is a plan view showing an example of electrode arrangement that forms an organic luminescence transistor device according to an embodiment of the present invention.
Figure 14:
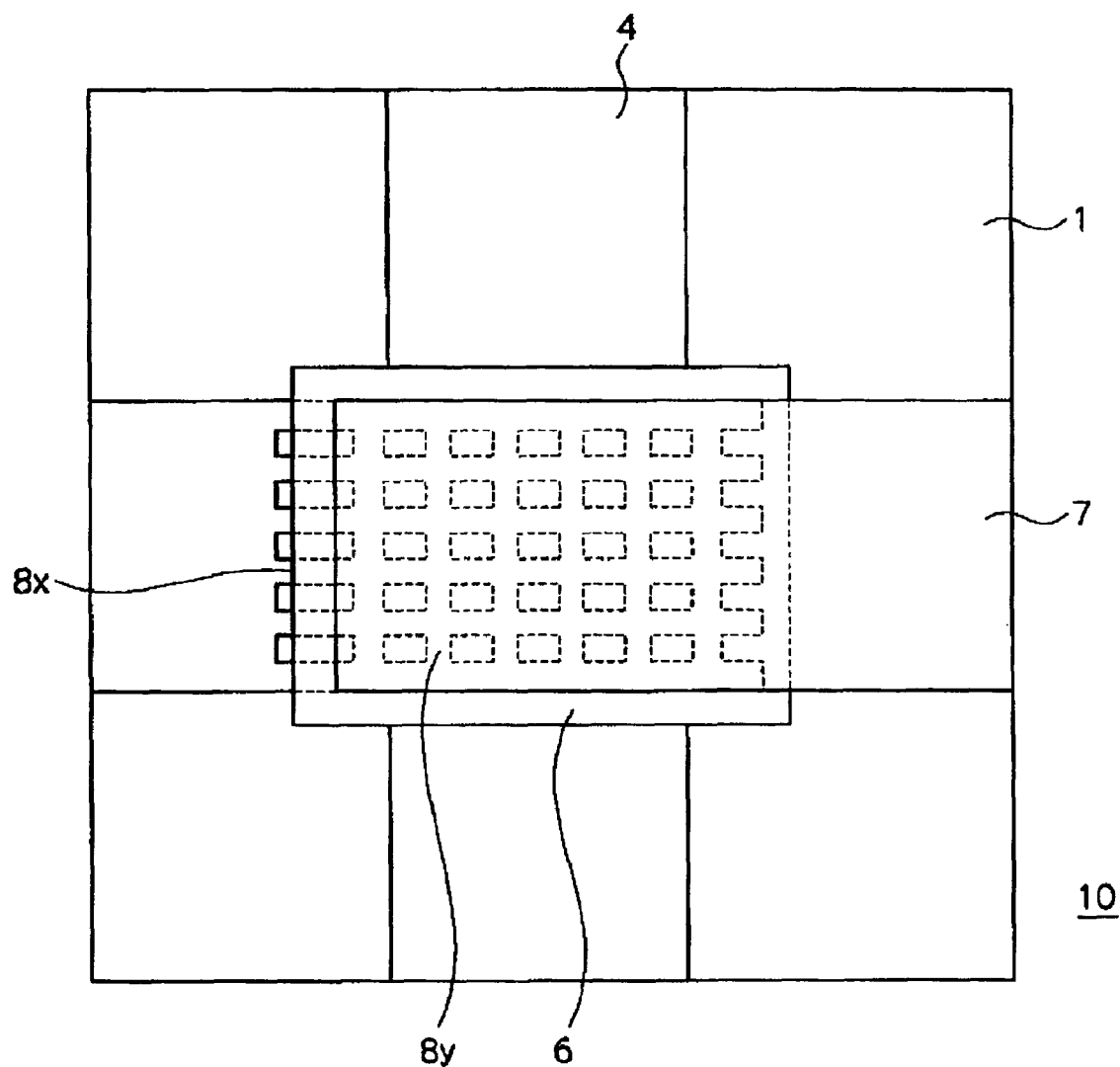
FIG. 14 is a plan view showing another example of electrode arrangement that forms an organic luminescence transistor device according to an embodiment of the present invention.

FIGS. 13 and 14 are plan view showing examples of electrode arrangement of the organic luminescence transistor device included in the organic luminescence transistor of the present embodiment. FIG. 13 is an arrangement view wherein the layered structure 8, which consists of the insulation layer 3, the assistance electrode 2 and the electric-charge-injection inhibiting layer 5, is formed in a comb-like shape. FIG. 14 is an arrangement view wherein the layered structure is formed in a lattice-like shape. The electrode arrangement shown in FIG. 13 includes a first electrode 4 extending in a vertical direction in a plan view; the layered structure 8 (including the assistance electrode 2) having a comb-like shape extending transversally from one lateral side perpendicularly to the first electrode 4; and a second electrode 7 extending transversally from the other lateral side perpendicularly to the first electrode 4 and overlappedly with the layered structure 8. In the electrode arrangement shown in FIG. 14, instead of the layered structure 8 of the comb-like shape shown in FIG. 13, layered structures 8x extending in an X-direction and layered structures 8y extending in a Y-direction are provided, which forms a lattice pattern. Herein, the arrangements shown in FIGS. 13 and 14 are mere examples.

In the luminescence display apparatus of the present embodiment, a plurality of luminescent parts is arranged in a matrix pattern. Each of the plurality of luminescent parts has an organic luminescence transistor device having the feature of the present invention.

Figure 15:
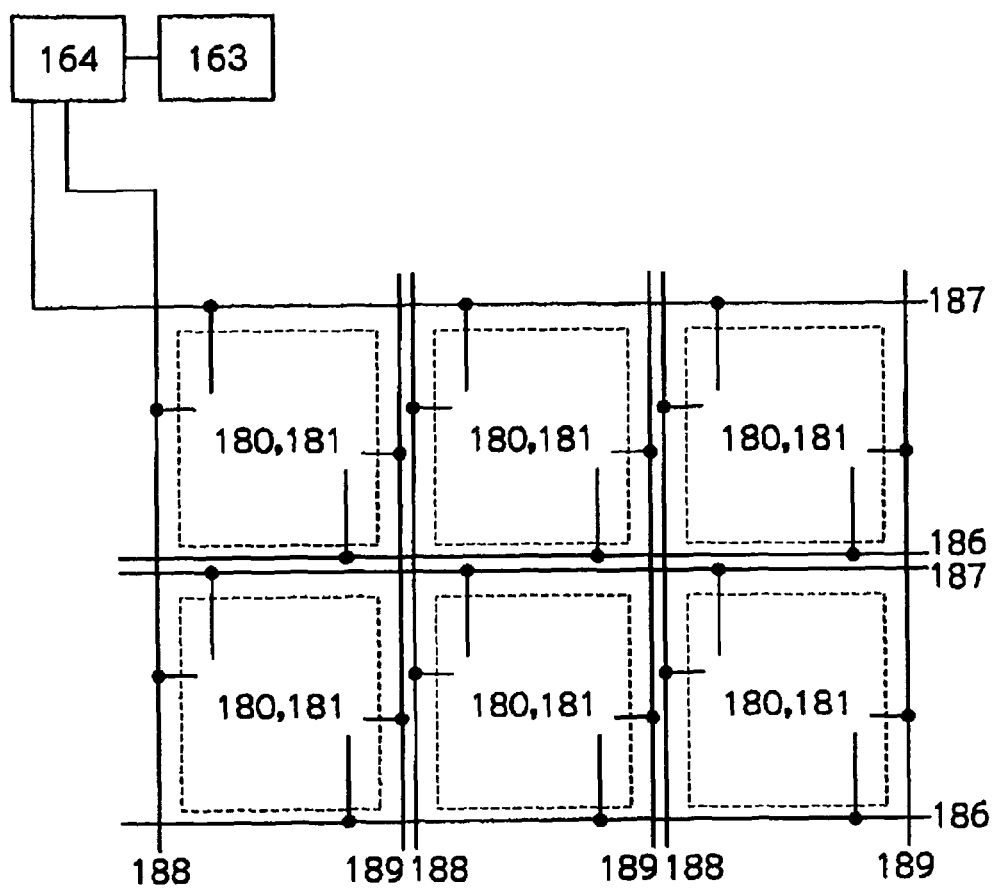
FIG. 15 is a schematic view showing an example of luminescent display apparatus in which an organic luminescence transistor device according to an embodiment of the present invention is embedded.
Figure 16:
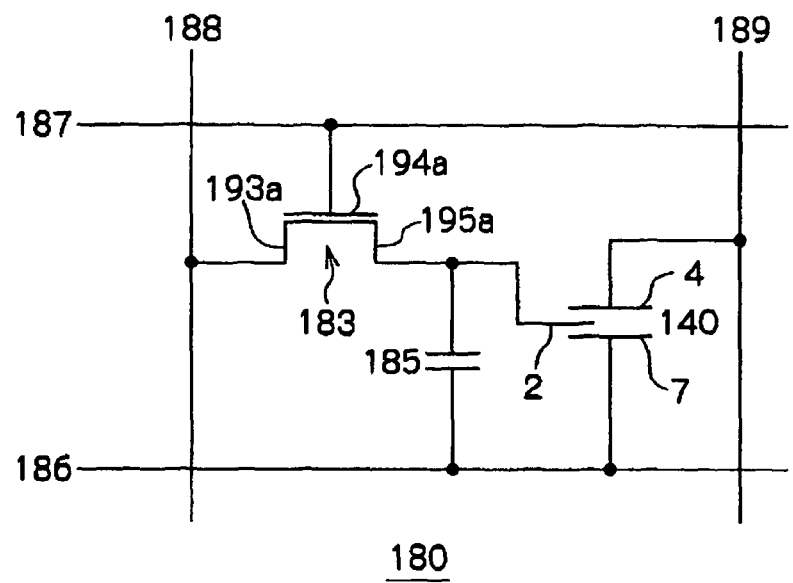
FIG. 16 is a schematic circuit diagram showing an example of organic luminescence transistor, including an organic luminescence transistor device according to an embodiment of the present invention provided for each pixel (unit device) in a luminescent display apparatus.

FIG. 15 is a schematic view showing an example of luminescent display apparatus in which an organic luminescence transistor device according to an embodiment of the present invention is embedded. FIG. 16 is a schematic circuit diagram showing an example of organic luminescence transistor, including an organic luminescence transistor device according to an embodiment of the present invention provided for each pixel (unit device) in a luminescent display apparatus.

The luminescent display apparatus explained here is an example wherein each pixel (unit device) 180 has one switching transistor.

Each pixel 180 shown in FIGS. 15 and 16 is connected to a first switching wire 187 and a second switching wire 188, which are arranged crisscross. As shown in FIG. 15, the first switching wire 187 and the second switching wire 188 are connected to a voltage control circuit 164. The voltage control circuit 164 is connected to an image-signal feeding source 163. In addition, in FIGS. 15 and 16, the reference numeral 186 represents a ground wire, and the reference numeral 189 represents a constant-voltage applying wire.

As shown in FIG. 16, the source 193a of a first switching transistor 183 is connected to the second switching wire 188, the gate 194a of the first switching transistor 183 is connected to the first switching wire 187, and the drain 195a of the first switching transistor 183 is connected to the assistance electrode 2 of the organic luminescence transistor 140 and one terminal of a capacitor 185 for maintaining a voltage. The other terminal of the capacitor 185 for maintaining a voltage is connected to the ground 186. The second electrode 7 of the organic luminescence transistor 140 is also connected to the ground 186. The first electrode 4 of the organic luminescence transistor 140 is connected to the constant-voltage applying wire 189.

Next, an operation of the circuit shown in FIG. 16 is explained. When a voltage is applied to the first switching wire 187, the voltage is applied to the gate 194a of the first switching transistor 183. Thus, the source 193 and the drain 195a are electrically connected. Under the situation, when a voltage is applied to the second switching wire 188, the voltage is applied to the drain 195a, so that electric charges are stored in the capacitor 185 for maintaining a voltage. Thus, even when the voltage applied to the first switching wire 187 or the second switching wire 188 is turned off, a certain voltage continues to be applied to the assistance electrode 2 of the organic luminescence transistor 140 until the electric charges stored in the capacitor 185 disappear. On the other hand, when a voltage is applied to the first electrode 4 of the organic luminescence transistor 140, the first electrode 4 and the second electrode 7 are electrically connected, so that an electric current flows from the constant-voltage feeding wire 189 to the ground 186 through the organic luminescence transistor 140. Thus, the organic luminescence transistor 140 becomes luminescent (emits light).

Figure 17:
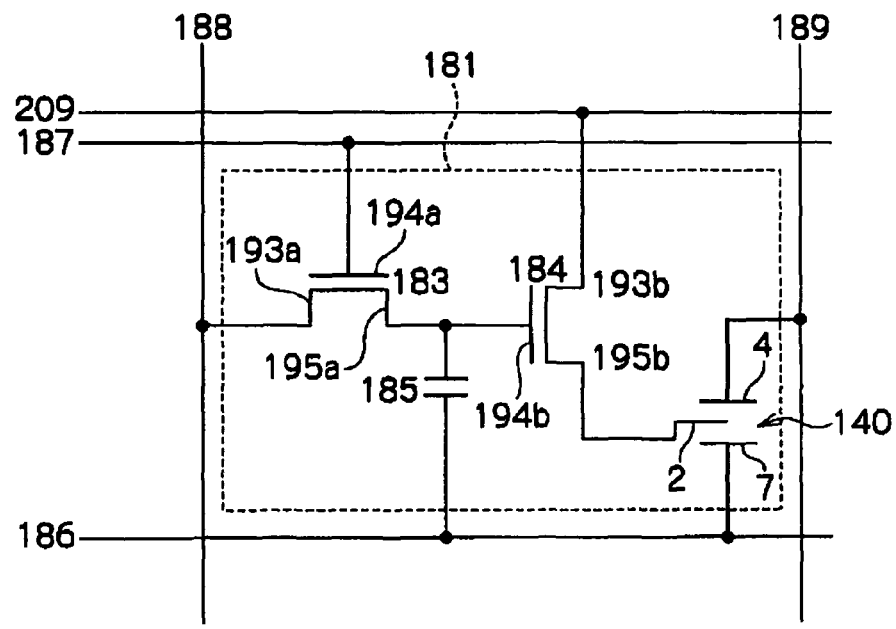
FIG. 17 is a schematic circuit diagram showing another example of organic luminescence transistor, including an organic luminescence transistor device according to an embodiment of the present invention provided for each pixel (unit device) in a luminescent display apparatus.

FIG. 17 is a schematic circuit diagram showing another example of organic luminescence transistor, including an organic luminescence transistor device according to an embodiment of the present invention provided for each pixel (unit device) in a luminescent display apparatus. The luminescent display apparatus explained here is an example wherein each pixel (unit device) 181 has two switching transistors.

In the same manner as the case shown in FIG. 16, each pixel 181 shown in FIG. 17 is connected to a first switching wire 187 and a second switching wire 188, which are arranged crisscross. As shown in FIG. 15, the first switching wire 187 and the second switching wire 188 are connected to a voltage control circuit 164. The voltage control circuit 164 is connected to an image-signal feeding source 163. In addition, in FIG. 17, the reference numeral 186 represents a ground wire, the reference numeral 209 represents an electric-current feeding wire, and the reference numeral 189 represents a constant-voltage applying wire.

As shown in FIG. 17, the source 193a of a first switching transistor 183 is connected to the second switching wire 188, the gate 194a of the first switching transistor 183 is connected to the first switching wire 187, and the drain 195a of the first switching transistor 183 is connected to the gate 194b of a second switching transistor 184 and one terminal of a capacitor 185 for maintaining a voltage. The other terminal of the capacitor 185 for maintaining a voltage is connected to the ground 186. The source 193b of the second switching transistor 184 is connected to the electric-current source 209, and the drain 195b of the second switching transistor 184 is connected to the assistance electrode 2 of the organic luminescence transistor 140. The second electrode 7 of the organic luminescence transistor 140 is connected to the ground 186. The first electrode 4 of the organic luminescence transistor 140 is connected to the constant-voltage applying wire 189.

Next, an operation of the circuit shown in FIG. 17 is explained. When a voltage is applied to the first switching wire 187, the voltage is applied to the gate 194a of the first switching transistor 183. Thus, the source 193 and the drain 195a are electrically connected. Under the situation, when a voltage is applied to the second switching wire 188, the voltage is applied to the drain 195a, so that electric charges are stored in the capacitor 185 for maintaining a voltage. Thus, even when the voltage applied to the first switching wire 187 or the second switching wire 188 is turned off, a certain voltage continues to be applied to the gate 194b of the second switching transistor 184 until the electric charges stored in the capacitor 185 disappear. Since the voltage is applied to the gate 194b of the second transistor 184, the source 193b and the drain 195b are electrically connected. Thus, an electric current flows from the constant-voltage feeding wire 189 to the ground 186 through the organic luminescence transistor 140. Thus, the organic luminescence transistor 140 becomes luminescent (emits light).

The image-signal feeding source 163 shown in FIG. 15 includes or is connected to a playback apparatus for the image information or an apparatus of converting inputted electro-magnetic information into an electric signal. The playback apparatus for the image information includes or is connected to an image-information media in which image information is recorded. The image-signal feeding source 163 is configured to convert an electrical signal, which has been sent from the playback apparatus for the image information or from the apparatus of converting inputted electro-magnetic information into an electric signal, into an electric signal manner that is receivable by the voltage control apparatus 164. The voltage control apparatus 164 further converts the electric signal from the image-signal feeding source 163, calculates which pixel 180, 181 should become luminescent and how long the pixel should become luminescent, and then determines the voltage applied to the first switching wire 187 and the second switching wire 188, the time period of application of the voltage and the timing thereof. Thus, the luminescent display apparatus can display a desired image based on the image information.

A color-image display apparatus can be obtained when adjacent small pixels respectively emit RGB three colors, that is, a red-based color, a green-based color and a blue-based color.

EXAMPLES

Examples are explained below.

Example 1

A laminar insulation layer was formed into a 100 nm thickness, by means of a sputtering of $SiO_2$, on a glass substrate 1 having a first electrode 4 (anode) that is made of an ITO film and has a 100 nm thickness. Then, on the laminar insulation layer, a laminar assistance electrode was formed into a 30 nm thickness, by means of a sputtering of Al. Then, a resist for an etching process (manufactured by TOKYO OHKA KOGYO CO. Ltd., trade name: OFPR800) was applied into a 2 μm thickness, exposed and developed, so that a resist pattern of a comb-like shape was formed. By using the resist pattern as a mask, Al was etched by a mixture solution of phosphoric acid:nitric acid=4:1. Thus, an assistance electrode 2 having the comb-like shape was formed into a wideness d1 of 100 μm. Then, by using the resist pattern of the comb-like shape as a mask, the laminar insulation layer 3 was dry-etched. Thus, an insulation layer 3 having the comb-like shape of the thickness of 100 nm was formed in the same size as the assistance electrode 2 in a plan view. Thereafter, the resist for an etching process was peeled off by a peeling solution (manufactured by TOKYO OHKA KOGYO CO. Ltd., trade name: Peeling Solution 104). Thereafter, a PVP-based resist (manufactured by TOKYO OHKA KOGYO CO. Ltd., trade name: TMR-P10) was formed into a 100 nm thickness, by means of a spin coating method, so as to cover the first electrode 4 and the assistance electrode 2. Then, the PVP-based resist was exposed and developed, so that the electric-charge injection inhibiting layer 5 was formed in the same size as the assistance electrode 2 in a plan view.

Next, a polyfluorene (manufactured by AMERICAN DYE SOURCE Inc., trade name: Poly[(9,9-dioctylfluorenyl-2,7-diyl) -co-(N,N'-diphenyl)-N,N'-di(p-butylphenyl) 1,4-di-amino-benzene)])]) as an electric-charge injecting material was applied by means of a spin coating method, on the first electrode 4 at an area not provided with the layered structure 8 consisting of the insulation layer 3, the assistance electrode 2 and the electric-charge injection inhibiting layer 5, so that an electric-charge injection layer 12 was formed into a thickness of 250 nm, which was greater than the thickness of the layered structure 8 (consisting of the insulation layer 3, the assistance electrode 2 and the electric-charge injection inhibiting layer 5).

Figure 18:
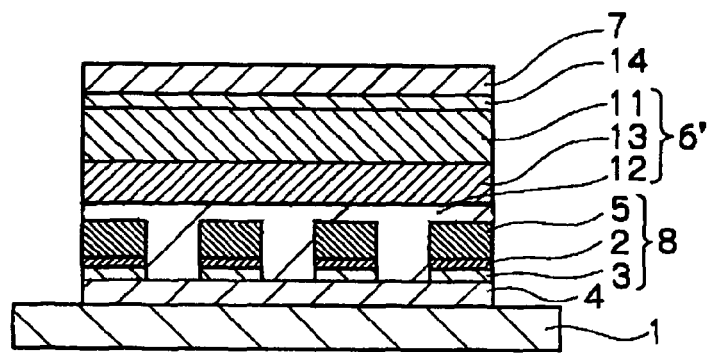
FIG. 18 is a schematic sectional view of an organic luminescence transistor device of an example 1.

Thereafter, α-NPD (40 nm in thickness) was deposited as an electric-charge (positive hole) transfer layer 13, by means of a vacuum deposition method, so as to cover the electric-charge injection layer 12. Furthermore, Alq3 (60 nm in thickness) as a luminescent layer 11/Lif (1 nm in thickness) as an electron injection layer 14/Al (100 nm in thickness) as a second electrode 7 were layered (laminated) in this order by means of a vacuum deposition method. Thus, an organic luminescent transistor device of the example 1 as shown in FIG. 18 was manufactured.

Example 2

Figure 19:
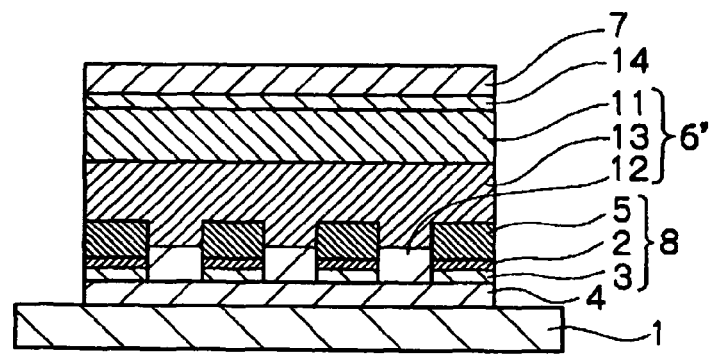
FIG. 19 is a schematic sectional view of an organic luminescence transistor device of an example 2.

A polyfluorene (manufactured by AMERICAN DYE SOURCE Inc., trade name: Poly[(9,9-dioctylfluorenyl-2,7-diyl) -co-(N,N'-diphenyl)-N,N'-di(p-butylphenyl) 1,4-di-amino-benzene)])]) as an electric-charge injecting material was applied by means of an ink-jetting method, so that an electric-charge injection layer 12 was formed into a thickness of 200 nm, which was smaller than the thickness of the layered structure 8 (consisting of the insulation layer 3, the assistance electrode 2 and the electric-charge injection inhibiting layer 5). Except the above, in the same manner as the example 1, an organic luminescent transistor device of the example 2 as shown in FIG. 19 was manufactured.

Example 3

Figure 20:
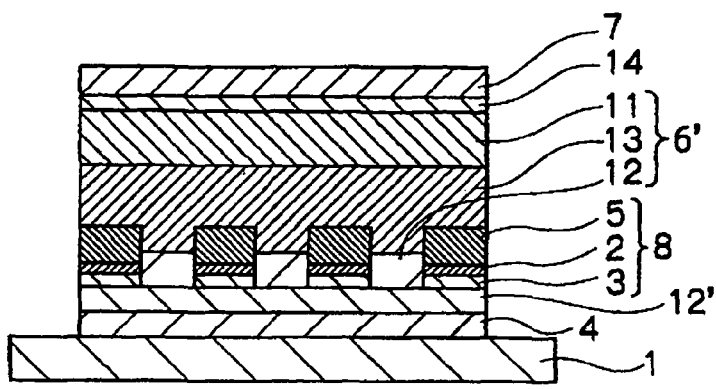
FIG. 20 is a schematic sectional view of an organic luminescence transistor device of an example 3.
Figure 21:
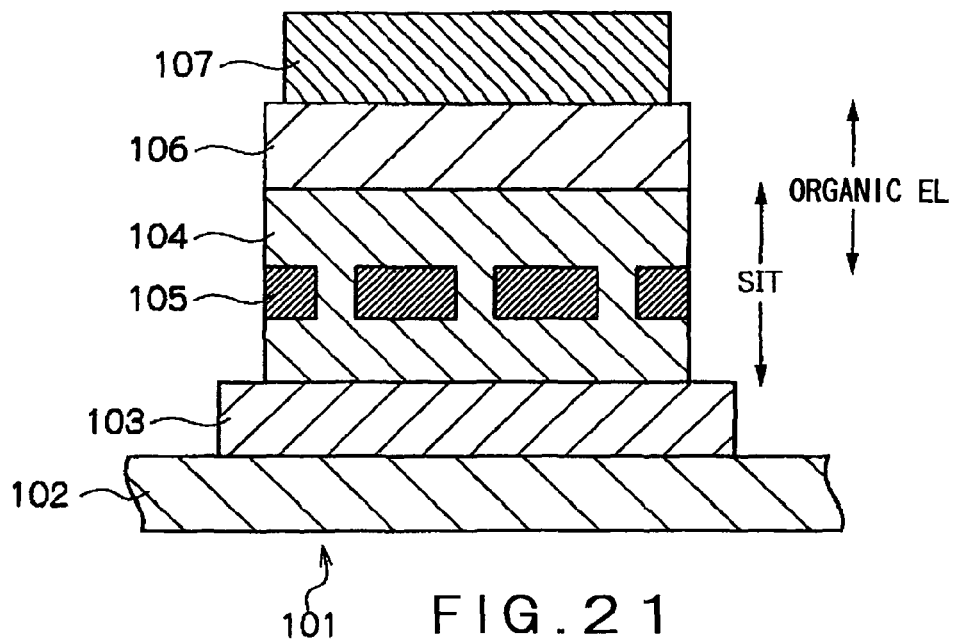
FIG. 21 is a schematic sectional view showing an example of conventional organic luminescence transistor composed of an SIT structure and an organic EL (electroluminescence) device structure.
Figure 22:
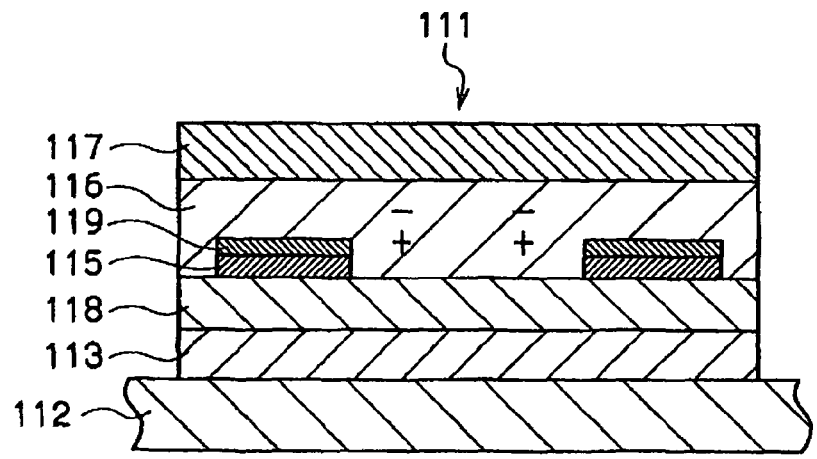
FIG. 22 is a schematic sectional view showing another example of conventional organic luminescence transistor composed of an SIT structure and an organic EL (electroluminescence) device structure.

Before the laminar insulation layer was formed on the first electrode 4, as an electric-charge (positive-hole) injection layer 12', a poly(3,4) ethylene-dioxy-thiophene/polystyrene-sulphonate (PEDOT/PSS, manufactured by BAYER AG, trade name: Baytron P CH8000) was deposited into a 80 nm thickness by means of a spin coating method, on the first electrode 4. Except the above, in the same manner as the example 1, an organic luminescent transistor device of the example 3 as shown in FIG. 20 was manufactured.

The invention claimed is:

1. An organic luminescence transistor device comprising a substrate,
a first electrode layer provided in a predetermined pattern on a side of an upper surface of the substrate,
a layered structure provided on the side of the upper surface of the substrate at an area not provided with the first electrode layer, the layered structure sandwiching the first electrode layer in a plan view, the layered structure including an insulation layer, an assistance electrode layer and an electric-charge-injection inhibiting layer in this order,
an organic EL layer provided at least on a side of an upper surface of the first electrode layer, and
a second electrode layer provided on a side of an upper surface of the organic EL layer,
wherein
a thickness of the first electrode layer and a thickness of the insulation layer are adjusted in such a manner that the first electrode layer is not in contact with the assistance electrode layer, and
the assistance electrode layer is in direct contact with the organic EL layer.

2. An organic luminescence transistor device according to claim 1, wherein
the organic EL layer includes, at least, an electric-charge injection layer and a luminescent layer.

3. An organic luminescence transistor device according to claim 1, wherein
the organic EL layer includes, at least, a luminescent layer including an electric-charge-injection material.

4. An organic luminescence transistor device according to claim 1, wherein
a second electric-charge injection layer is further provided between the first electrode layer and the organic EL layer and/or the layered structure provided on the first electrode layer.

5. An organic luminescence transistor device according to claim 1, wherein
a third electric-charge injection layer for the second electrode layer is provided between the organic EL layer and the second electrode layer.

6. An organic luminescence transistor device according to claim 1, wherein the electric-charge-injection inhibiting layer is made of an insulation material.

7. An organic luminescence transistor device according to claim 1, wherein
the first electrode layer functions as an anode, and the second electrode layer functions as a cathode.

8. An organic luminescence transistor device according to claim 1, wherein
the first electrode layer functions as a cathode, and the second electrode layer functions as an anode.

9. An organic luminescence transistor comprising
an organic luminescence transistor device according to claim 1,
a first voltage-feeding unit configured to apply a constant voltage between the first electrode layer and the second electrode layer of the organic luminescence transistor device, and a second voltage-feeding unit configured to apply a variable voltage between the first electrode layer and the assistance electrode layer of the organic luminescence transistor device.

10. A luminescence display apparatus comprising a plurality of luminescent parts arranged in a matrix pattern, wherein
each of the plurality of luminescent parts has an organic luminescence transistor device according to claim 1.

11. A manufacturing method of an organic luminescence transistor device, the manufacturing method being for manufacturing an organic luminescence transistor device, the manufacturing method comprising the steps of:
preparing a substrate on which a first electrode layer has been formed in a predetermined pattern,
providing a layered structure on a side of an upper surface of the substrate at an area not provided with the first electrode layer such that the layered structure sandwiches the first electrode layer in a plan view, the layered structure including an insulation layer, an assistance electrode layer and an electric-charge-injection inhibiting layer in this order,
providing an organic EL layer on a side of an upper surface of the first electrode layer, and
providing a second electrode layer on a side of an upper surface of the organic EL layer,
wherein
a thickness of the first electrode layer and a thickness of the insulation layer are adjusted in such a manner that the first electrode layer is not in contact with the assistance electrode layer, and
the assistance electrode layer is in direct contact with the organic EL layer.

12. A manufacturing method of an organic luminescence transistor device according to claim 11, wherein
in the step of providing the layered structure,
as a material for forming the electric-charge-injection inhibiting layer, a photosensitive material that becomes removable by photoirradiation is used,
as a material for one or both of the insulation layer and the assistance electrode layer, a material that doesn't transmit an exposure wavelength of the photosensitive material is used, and
after the photosensitive material is provided on the side of the upper surface of the first electrode layer so as to cover the assistance electrode layer, the photosensitive material is exposed to light from a side of the substrate so as to remove only the photosensitive material provided directly on the first electrode layer, so as to form the electric-charge-injection inhibiting layer.

13. A manufacturing method of an organic luminescence transistor device according to claim 11, wherein
in the step of providing the organic EL layer, the organic EL layer is formed by a patterning process, the patterning process being a mask deposition process or an ink-jetting method.

14. A manufacturing method of an organic luminescence transistor device according to claim 11, wherein
a second electric-charge injection layer made of the same material as or a different material from the electric-charge injection layer is provided in advance on the first electrode layer, before the insulation layer of the layered structure is provided on the first electrode layer or the substrate.

15. An organic transistor device comprising
a substrate,
a first electrode layer provided in a predetermined pattern on a side of an upper surface of the substrate,
a layered structure provided on the side of the upper surface of the substrate at an area not provided with the first electrode layer, the layered structure sandwiching the first electrode layer in a plan view, the layered structure including an insulation layer, an assistance electrode layer and an electric-charge-injection inhibiting layer in this order,
an organic semiconductor layer provided at least on a side of an upper surface of the first electrode layer, and
a second electrode layer provided on a side of an upper surface of the organic semiconductor layer,
wherein
a thickness of the first electrode layer and a thickness of the insulation layer are adjusted in such a manner that the first electrode layer is not in contact with the assistance electrodes layer, and
the assistance electrode layer is in direct contact with the organic semiconductor layer.

* * * * *